United States Patent [19]
Onffroy et al.

[11] Patent Number: 5,615,335
[45] Date of Patent: Mar. 25, 1997

[54] STORAGE SYSTEM SELF-TEST APPARATUS AND METHOD

[75] Inventors: Joshua P. Onffroy, Framingham; Rehan Masood, Rockland; Brian B. Mullahy, Leominster; Harold F. Pritoni, Jr., Medfield, all of Mass.

[73] Assignee: EMC Corporation, Hopkinton, Mass.

[21] Appl. No.: 337,638

[22] Filed: Nov. 10, 1994

[51] Int. Cl.$^6$ ............................................. G06F 11/00
[52] U.S. Cl. .............................. 395/183.06; 395/183.18; 395/183.01
[58] Field of Search ................... 395/183.18, 183.01, 395/183.03, 183.06; 371/22.5, 22.6

[56] References Cited

U.S. PATENT DOCUMENTS

| | | | |
|---|---|---|---|
| 4,342,084 | 7/1982 | Sager et al. | 395/183.18 |
| 4,482,953 | 11/1984 | Burke | 395/183.03 |
| 4,777,586 | 10/1988 | Matsubara et al. | 395/183.18 |
| 5,210,860 | 5/1993 | Pfeffer et al. | 395/183.18 |
| 5,390,186 | 2/1995 | Murata et al. | 395/183.18 X |

Primary Examiner—Robert W. Beausoliel, Jr.
Assistant Examiner—Ly V. Hua
Attorney, Agent, or Firm—Maureen Stretch

[57] ABSTRACT

A self-testing storage system apparatus and method uses pre-recorded test sequences at a designated location within a storage system, so that a user interface task, residing in the controller of the storage system responds to a signal to initiate testing sent through a user interface device coupled to the controller. The user interface task causes the test sequences to be transferred into the controller. The user interface task also disables communications through the host interface, determines from parameters sent over the user interface which tests are to be run, and causes them to be executed as manufacturing self-test tasks from within the controller, using the controller's microprocessor and memory. Depending upon the parameters provided through the user interface device, each manufacturing self-test task executes sequential and random read/write/compare tests, data or command saturation tests, RAID evaluation tests, or other tests within the storage system.

35 Claims, 17 Drawing Sheets

Fig. 15a

| Port | Drive | CacheAddress | EPattern | LBA | maxlba | DATE | Time |
|------|-------|--------------|----------|-----|--------|------|------|
| a | b | cccccccc | dddddddd | eeeeeeee | ffffffff | mmddyy | hhmmss |

Fig. 15b

| SelfTest Status | | | | | | | | | |
|---|---|---|---|---|---|---|---|---|---|
| Port | Drive | SEQ: | RAN: | SAT: | PAT: | FLY: | DATA: | PARITY | PHANTOM | CACHE |

STORAGE SYSTEM SELF-TEST APPARATUS AND METHOD

BACKGROUND OF THE INVENTION

This invention relates generally to the manufacture and testing of electromechanical or electronic storage systems and devices and more specifically to burn-in testing of such devices.

Manufacturers of storage systems such as Redundant Arrays of Inexpensive Disks (RAID) systems containing high-speed mass storage devices or manufacturers of other storage devices such as magnetic tape drive systems know that such devices are subject to infant mortality rates caused by latent defects in the devices. Devices that survive their early hours of operation are more likely to have a long and useful product life. Most of the failing devices can be detected by performing some method of burn-in testing to exercise the devices strenuously over a prolonged period of time in ways that stress the limitations of the systems. Ideally, these tests determine the validity of each of the physical drives in a system, and test the hardware, firmware, and software of the storage system's controller. Burn-in tests are usually more rigorous than ordinary diagnostic tests, and, if possible, attempt to create or simulate the conditions that are likely to induce errors. Defective devices detected in this manner can either be repaired, scrapped or have defective sectors or tracks marked accordingly.

In traditional manufacture of electromechanical magnetic media storage systems, one or more disk or tape drives is connected by an internal bus to a controller, which, in turn, is connected to a host computer by means of an input/output bus or channel. For disk or direct access storage device systems, commands are sent from the host computer to the controller, using an intelligent interface or protocol, perhaps one of the industry standards such as SCSI or IPI or another to send commands to the disk to effect a read or a write of data. A disk that is designed for SCSI protocol, will be connected to a controller capable of using SCSI protocol, which, in turn, will use that protocol to communicate over the bus with the host computer. Most disk and tape controllers contain microprocessors and memory which are used to store and execute these commands.

A dedicated host computer, such as a mini-computer, personal computer or microprocessor is used in burn-in testing to send a series of read and write and compare commands in a specific protocol, to controllers of the systems being tested. For random access devices, these are issued both as sequential reads and writes and random reads and writes. These tests are often coupled with tests that attempt to saturate the device with data or commands, to put stress on the mechanical parts of the system, as well as on the electronics and software.

As storage systems have become faster and more complex, burn-in testing becomes more difficult to do in a cost effective manner. A storage system that uses the SCSI protocol, needs to be tested with commands that conform to that protocol, while systems that use IPI, for example, or some other protocol, will need a different test setup.

The storage capacity of systems has increased greatly, so that storage systems capable of reading and writing billions of bytes of data in files are commonplace. With this increase in capacity, reliability becomes more important. RAID systems were developed to provide reliable storage affordably, by using ordinary inexpensive disks, combined with sophisticated hardware and software techniques to record or stripe data or parity or both over several different physical drives in a subsystem.

RAID systems are designed so that if a physical track or drive fails, the data can be reconstructed from the data and parity information on the other drives. This greatly increases the complexity of the hardware, firmware and software used in controllers of storage systems that incorporate RAID. Several different types of RAID systems exist, each having performance, reliability and cost characteristics suited to differing file sizes and applications.

A storage system using RAID 3, therefore, needs different burn-in test configurations from one using RAID 5. A RAID 3 system, for example, usually stripes data across a number of physical drives one bit at a time and writes parity data, used to construct lost data, to a single extra parity drive. A RAID 5 storage system, by contrast, usually stripes data and parity across a number of drives. Thus, the number of seeks or movements of the disk read/write heads may vary considerably between these two types of RAID for the same size file or total number of reads/writes. A test that might be a severe exercise for disk arms and heads in one kind of RAID system, may have much less impact on another.

In conventional burn-in testing, it has not been feasible to test a number of aspects of RAID systems, simply because the RAID hardware and software built into the storage system's controller may correct or prevent the occurrence of the situations one may want to test. For example, some RAID systems are designed to recover from certain types of file corruption such as data corruption or parity corruption. Using a conventional system, it is difficult to test these features in action on a specific drive. A host computer cannot really create a corrupted data block to send to a RAID storage system, since the host's own error correction features usually won't permit it. If the host could somehow create and send a corrupt data block, it would probably violate the protocol being used by the system, and would thus be rejected by the bus or the controller, before anything was written out to a disk. Similarly, it is difficult to gain access to the parity sectors of a RAID storage system through the host computer interface. Consequently, it is also difficult to intentionally corrupt parity on a disk during burn-in, to verify the controller's RAID recovery features. For storage systems that have a second interface, such as an engineering interface, which permits the user to bypass the normal control of the storage system, corrupt data or parity blocks might be entered manually, by an engineer or test technician, which would be inordinately expensive, or by a programmed computer. For a computer to replace the technician for this purpose, a dedicated computer for each system under test would be needed. Certain aspects of a RAID system may still be difficult or impossible to test, in this way, such as whole disk crashes or failures.

Different combinations of protocols and RAID or non-RAID types of systems also arise.

While one computer might be able to store and control and operate many different types of tests for different storage systems, the effectiveness of data and command saturation tests, and many other types of stress tests is directly proportional to how fast the system under test can be made to operate. If the host computer used for testing is handling too many storage systems, or too many different protocols, or even if the storage system being tested is a large one with several disk drives, speed suffers.

Most storage systems today include several types of internal memory within a controller, including fast cache memory to serve as a buffer for blocks of data or commands going to and from individual disks. These memories are selected to be fast enough to keep up with or stay ahead of the commands from the host. Thus, typical host computer interfaces cannot issue commands fast enough to a controller to cause such cache memories to fill. As a result, cache saturation conditions are difficult to instigate.

In disk manufacturing, it is known that some types of errors occur as a result of degradation over time. That is, intermittent errors may occur first, before a solid failure occurs. In burn-in testing, therefore, the more thoroughly a device can be exercised and stressed to its limits, the more likely it is problems can be found before a product is shipped to a customer. The more testing that can be accomplished in a given time period, the better the result.

For this reason, disk manufacturers often perform burn-in testing of storage systems by dedicating a host computer or host computer emulator to each system to improve the speed with which each system is tested. Many of the larger storage systems are designed to be used by more powerful and expensive mainframe or mid-range computers. Using such expensive systems in burn-in testing is too costly, so many manufacturers use inexpensive personal computers to emulate the large hosts.

Each host computer emulator must be properly configured for a given storage system protocol (SCSI, IPI, other) and type (RAID 5, RAID 3, non-RAID) for disks. If the host is emulating a particular mid-range or mainframe system, additional hardware and software upgrades may be needed for the host computer emulator.

Since burn-in tests are usually done over 3 to four days, this approach is still costly in its use of equipment and software and also creates a bottleneck in the manufacturing cycle. Each host computer emulator requires individual configuring and monitoring by someone, so labor costs tend to increase. Minicomputer or midrange systems are available that can test up to 8 storage systems, at once, but these are expensive computers. Using the less expensive personal computers, a PC has to be dedicated to each system under test, to get sufficient speed. So, to do burn-in testing of 50 new systems, from 7 to 50 host computer emulators are needed. Even with relatively inexpensive personal computers, this is costly both in equipment and space occupied by the equipment. Changing product lines or adding new protocols may require further upgrades to many or all of the host computer emulators.

In many cases, even the use of a dedicated midrange or mainframe computer may not sufficiently tax the storage system's components. While more tests can be run in a given time in this way, controller cache memories, for example, are still not likely to be saturated, simply because they are designed to keep up with the host.

It is an object of the present invention to provide a method and apparatus for burn-in testing of storage systems that eliminates the need for a dedicated host computer or host computer emulator by making the storage system self-testing.

It is another object of the present invention to provide a method and apparatus for self-testing storage systems that enables conventional tests to be run faster or more effectively or both.

It is an object of the present invention to simplify the testing of multiple protocols and types of systems, eliminating or greatly reducing additional hardware and software upgrades and costs.

It is another object of the present invention to permit testing of RAID disk storage systems, including testing of differing types of RAID recovery hardware, software, and firmware.

Yet another object of the invention is to be adaptable to new products and types of systems, as new tests for these are devised.

SUMMARY OF THE INVENTION

These and other objects of the invention are achieved by pre-recording test sequences at a designated location within a storage system, so that a user interface task, residing in the controller of the storage system responds to a signal to initiate testing sent through a user interface device coupled to the controller. The user interface task causes the test sequences to be transferred into the controller. The user interface task also disables communications through the host interface, determines from parameters sent over the user interface which tests are to be run, and causes them to be executed as manufacturing self-test tasks from within the controller, using the controller's microprocessor and memory. Depending upon the parameters provided through the user interface device, each manufacturing self-test task executes sequential and random read/write/compare tests, data or command saturation tests, RAID evaluation tests, or other tests within the storage system.

It is a feature of the present invention that, for devices capable of sequential reads and writes, a series of sequential writes, reads and compares may be run across the full block address range on each device, to test the integrity of the controller cache, hardware, firmware, and software for these features, as well as the integrity of the storage media. Devices capable of random access may be tested with random writes, reads and compares.

It is another aspect of the present invention that it can be used to perform effective saturation or worst case testing. Command saturation tests can be run to send randomly chosen commands to test the controller-disk interoperation. A variety of pattern tests can be used to verify the disk media by writing multiple potential problem-causing patterns across the full data block address range of each drive.

Yet another aspect of the present invention is that specially developed user test patterns can be communicated through the user interface to cause the present invention to perform saturation tests, if desired. A cache write/read/compare test, for example, can be performed by writing a pattern in the controller's cache, and then repeatedly reading and comparing it, from within the controller, to test controller communication integrity and simulate a worst-case scenario.

A further feature of the present invention is that butterfly seek tests can be performed using the present invention to cause each drive in a random access storage system to repeatedly seek back and forth over the data block range, to verify disk head-to-platter interaction.

Still another feature of the present invention is that it makes testing of many aspects of RAID systems possible or more practical. The self-testing method and apparatus of the present invention permit data and parity corruption tests to be performed easily and effectively in RAID systems. The failure of a drive can be simulated to test a RAID system's recovery from such a failure. A variety of RAID specific tests can be run to test a RAID system's cache management code, including double cache writes, and RAID writes finishing before or after various types of host reads or writes.

Yet another aspect of the present invention is that it can accommodate new types of tests for new protocols or new devices easily. As these tests are developed, they are included in the test sequences pre-recorded in a selected location in the system. As the newly manufactured systems are activated for burn-in testing through the user interface, these new tests can be invoked.

It is a feature of the present invention that the need for host computers or host computer emulators during the manufacturing burn-in process is either minimized greatly or eliminated completely, resulting in over a million dollars in cost savings. Since tests can be activated through the user interface, and operate from within the storage system itself, hardware and software upgrades for host computer emulators are also eliminated, as is the need for configuring and monitoring of the hosts.

Yet another aspect of the present invention is that conventional tests such as the sequential and random write/read/compare tests can be executed more effectively using the method and apparatus of the present invention.

It is another feature of the invention that by being self-contained within the storage system, it is able to simulate or generate conditions, situations and speeds for burn-in tests that cannot be duplicated by an external host computer or host computer emulator.

Still another aspect of the invention is that it can be used in other stages of a product's life, such as design verification, before volume manufacturing, or for use in subsequent testing to reproduce errors that may not be recreated in any other way.

BRIEF DESCRIPTION OF THE DRAWINGS

FIG. 15a is a block diagram illustrative of a master log entry made using the present invention.

FIG. 15b is a block diagram of a status log entry format.

DETAILED DESCRIPTION OF THE INVENTION

Figure 1A:
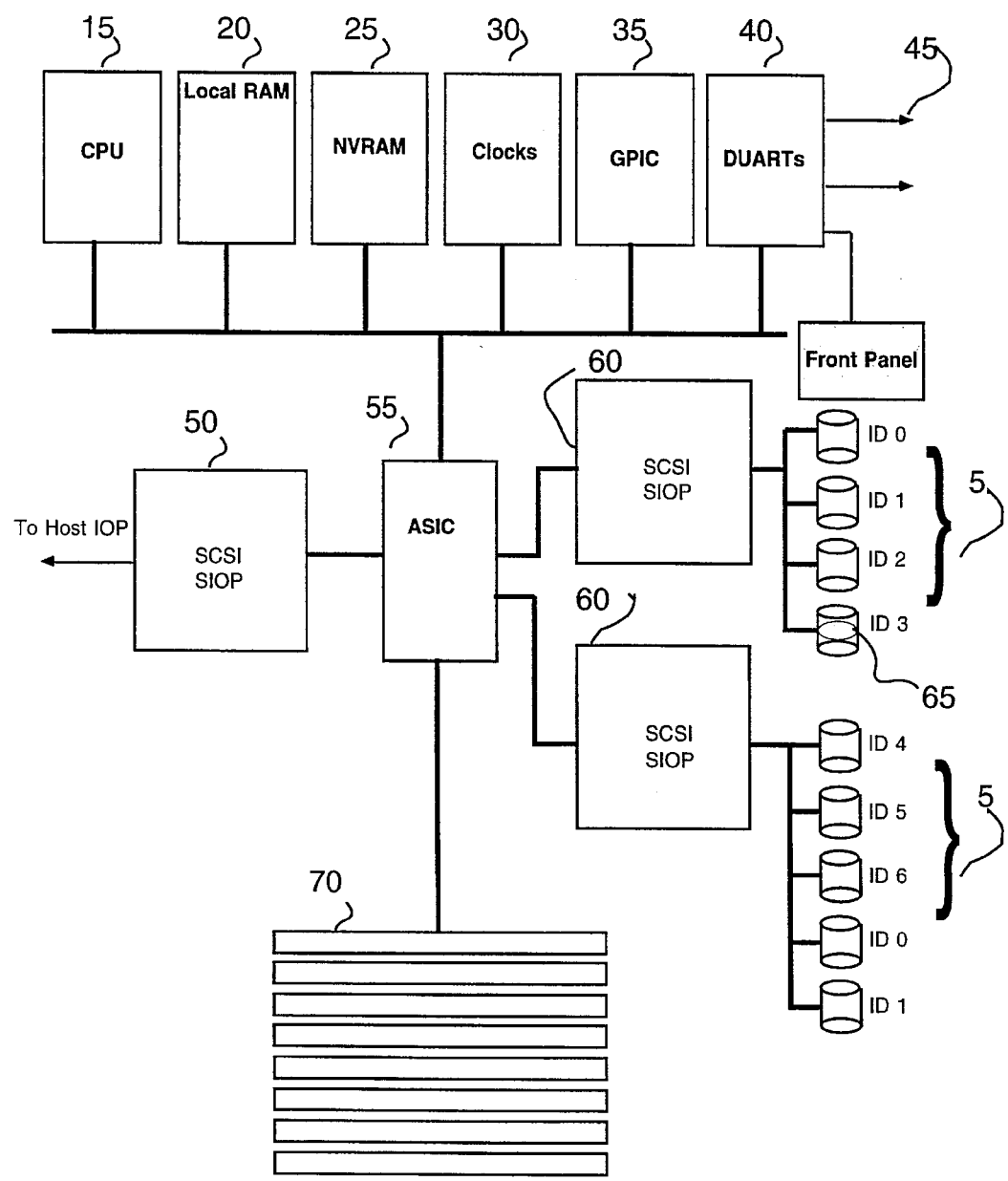
FIG. 1a is a block diagram of a self-testing storage system constructed according to the method and apparatus of the present invention.

A self-testing storage system 10 constructed according to the present invention is shown in block diagram form in FIG. 1a. Self-testing storage system 10 includes one or more physical direct access storage devices 5, connected to input/output processors 60, which are controlled through applications specific integrated circuit ("ASIC") 55. ASIC 55 controls a cache 70, and is connected to a Central Processing Unit ("CPU") 15, a Random Access Memory, local RAM 20, non-volatile RAM NVRAM 25, Clocks 30, timers, interrupt, and control clock, together at GPIC 35, a DUART (dual universal asynchronous receiver/transmitter) integrated circuit 40 as well as to a front-end input/output processor 50 that can be connected to a host interface. In a preferred embodiment of the present invention, DUART integrated circuit 40 is connected to an asynchronous user interface device by an RS232 standard interface 45.

As will be apparent to those skilled in the art, drives 5 can be any of a number of types of recording devices capable of being written and read. These include, but are not limited to, magnetic tape and disk drives, optical drives, CD-ROM drives, Write-Once-Read-Many WORM drives, floppy disk drives, or hard drives and so on. A storage system may be comprised of only one physical drive or of many. The method and apparatus of the present invention can be implemented in storage systems having only sequential access devices, such as magnetic tape drives or in systems with random access devices, such as disks and drums. The method and apparatus of the present invention can be used in systems having different protocols, such as Small Computer Systems Interface (SCSI) 1 or 2, or IPI protocols or other protocols used by the manufacturer of the devices in question. Similarly, self-testing disk storage systems can be built according to the method and apparatus of the present invention whether the disk storage systems use RAID technologies and procedures or not.

In a preferred embodiment of the present invention, burn-in test sequences using the appropriate protocol and procedures for the device being tested are recorded, in advance of testing, on one or more of the drives 5, of storage system 10 in a predefined location 65. In a preferred embodiment, these tests are executed as a stage of the device reliability testing process for direct-access storage device (DASD) systems being processed through manufacturing toward shipment.

A preferred embodiment of the present invention used for a RAID storage system, performs both RAID and non-RAID testing. Non-RAID tests are selected from several tests which determine the validity of each of the physical drives on a system as well as exercise the hardware and firmware of the target system. These Non-RAID tests include: sequential write, read, and compare; random write, read and compare; command saturation; multiple-worst-case-pattern saturation; single-pattern saturation; cache write, read and compare; and butterfly-seek test. The first four of these tests are the most commonly used for disks.

RAID tests that can be selected include: data error tests, parity error tests, cache tests, and failed drive tests.

Figure 1B:
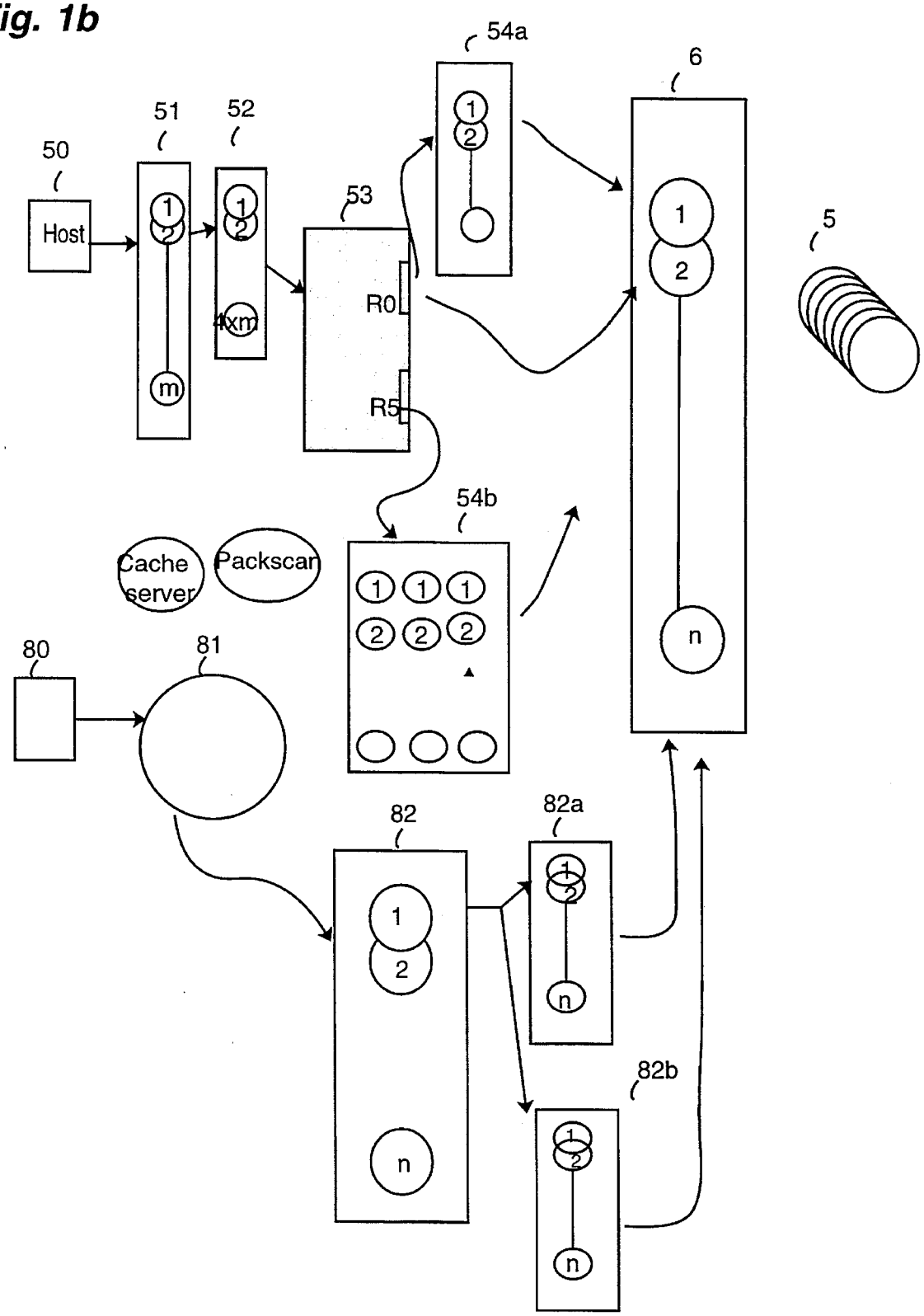
FIG. 1b is schematic diagram showing the major logical tasks performed by a storage system implemented according to the method and apparatus of the present invention.

Turning now to FIG. 1b, a schematic diagram of the major logic tasks of a preferred embodiment of the present invention is shown. A signal from the host interface 50, is received by one or more host throttle tasks 51. Host throttle tasks 51 are created for each logical facility in a storage subsystem 10. In Non-RAID systems, there will usually be one logical facility for each physical disk drive 5. However, in RAID systems, depending on the type of RAID being used, the number of logical facilities may be different from the number of actual physical drives. The host computer sees the logical facilities as the only disk drives, while the storage system controller must understand how many logical facilities a host thinks exist, as well as how many actual drives exist.

Still in FIG. 1b, these host throttle tasks 51 may create subtasks known as command processing tasks 52. The number of these may vary, as well. In a preferred embodiment for testing SCSI devices, four of these tasks are created for each host throttle task 51.

Cache code 53, is not a task, but code that is contained in the cache. Several different tasks can execute the same copy of cache code 53 in order to cause various reads and writes to occur. As shown here in FIG. 1b, cache code 53 has routines R0 and R5, for RAID 0 type devices and RAID 5 type devices, respectively. Routine R0 can send write commands to RAID 0 tasks 54a which collapse the writes into RAID 0 formats. Routine R0 can also send reads directly to drive Tasks 6.

Still in the cache code 53 of FIG. 1b, Routine R5 can send both writes and reads to RAID 5 tasks 54b. RAID 5 tasks 54b include a queuing task for each physical drive, in the system, a pre-processing task for each physical drive in the system, and a write task for each drive in the system. These RAID 5 tasks 54b, after receiving commands from Routine R5, send the appropriate commands on to drive tasks 6.

In a preferred embodiment, there is one drive task 6 for each physical drive 5 in self-testing storage system 10. In FIG. 1b, the flow of operations from the host interface 50, through host throttle tasks 51, command processing tasks 52, cache code 53, and the RAID 0 tasks 54a or RAID 5 tasks 54b, through to drive tasks 6 and drives 5, is the flow that should take place during normal operation of the storage system. This is the flow that is exercised and tested by the method and apparatus of the present invention without the need for a dedicated host computer.

Still in FIG. 1b, a signal from user interface device 80, creates an interrupt that "awakens" user interface task 81. User interface task 81 analyses the parameters sent from the user interface device to determine which tests are to be run. In a preferred embodiment, in testing a RAID 5 system, both Non-RAID and RAID-specific test are performed on each drive. Thus, user interface task 81 creates a manufacturing self-test task 82, for each physical drive 5. Each manufacturing self-test task 82, in turn, can create two sub-tasks or daughter tasks, a Non-RAID specific task 82a and a RAID-specific task 82b. Each manufacturing self-test task 82 sends the appropriate information to each of its sub-tasks about the tests to be performed. The subtasks, in turn cause the appropriate set of test sequences to be run. Alternatively, in a preferred embodiment, user interface task 81 can create all of the tasks as it analyzes the parameters it receives from the user.

Figure 2A:
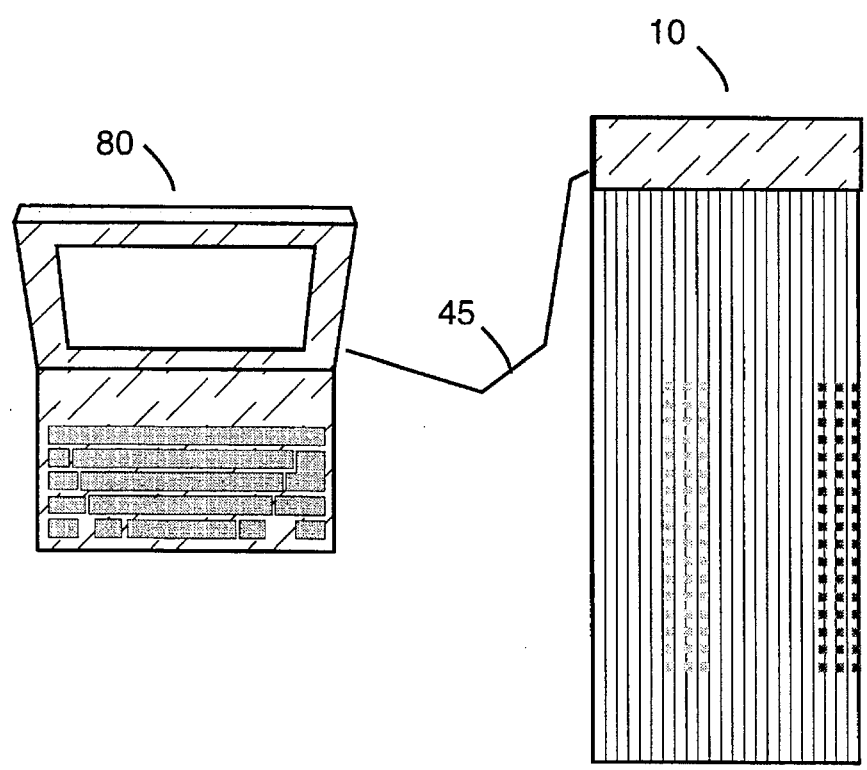
FIG. 2a is a perspective view of a preferred embodiment of the present invention showing a storage system with its user interface connected to a laptop computer.

Turning to FIG. 2a, a laptop computer is the user interface device 80 connected to storage system 10. As will be apparent to those skilled in the art, any of a number of other devices, such as low-cost video or character terminals or other devices capable of transmitting and receiving signals can be used. In a preferred embodiment, RS-232 asynchronous connections between the storage system and the user interface device 80 are used. In a preferred embodiment, one cabinet can contain up to 8 storage systems 10, and all can be activated for testing in this way. Applicant's co-pending application Ser. No. 08/272,194, describes this is detail.

In a preferred embodiment, separate tasks are created for the Non-RAID specific and RAID-specific tests, because the RAID-specific tests use cache differently. In testing, if an error occurs, it is important to "freeze the box" or storage system 10, to capture all the relevant data about the error at the time it occurs. For Non-RAID specific tests, only a portion of the cache needs to be locked or frozen, but for RAID-specific tests, all of cache needs to be locked or frozen, so that all relevant data is preserved. Thus, two separate tasks are created for each drive 5.

In a preferred embodiment of the present invention the tests to be run are determined by the user by transmitting a run command with parameters over the user interface device 80. Each of the individual tests may be run singly, or in combination with any of the others. A number of iterations count or parameter entered by the user through user interface device 80 determines how many times to execute the test-combination which has been selected. The results of each iteration are stored in a log which may be viewed by the user using another command.

Returning to FIG. 1a, a preferred embodiment of the invention uses a commonly available real-time multi-tasking operating system, known as pSOS. This operating system is capable of running on CPU 15 included in the controllers of storage systems constructed according to the present invention. In a preferred embodiment, CPU 15 is a Motorola 68EC030 16-bit microprocessor, running at 40 Megahertz but as will be apparent to those skilled in the art any of a number of other microprocessors and operating systems can be used. Alternatively, custom microprocessors, with custom real-time ASIC chip functions could be used, as well. In this embodiment of self-testing storage system 10, local RAM 20 is configured at 4 megabytes, of 5-2-2-2 burst rate. In this embodiment, at least 32 kilobytes of NVRAM 25 are used. Commonly available industry standard clocks 30, GPIC 35, and DUART integrated circuits 40 are used. As depicted in FIG. 1, a SCSI disk system is under test, hence the controller shown here uses SCSI input/output processors 60, and a SCSI input/output processor 50 to the host interface.

Still in FIG. 1, local RAM 20, also known as Static Random Access Memory, includes the logic of user interface task 81 in a preferred embodiment of the present invention—in this embodiment, code for the logic of user interface task 81 operates as firmware, that is, it is brought into local RAM 20 when the system is powered up. In another embodiment, the logic of user interface task 81 may be included in a software program which is downloaded from user interface device 80 and brought into RAM 20 for execution. Or, if desired, custom integrated circuits or ASIC chips could be built to incorporate the logic of user interface task 81.

Figure 2B:
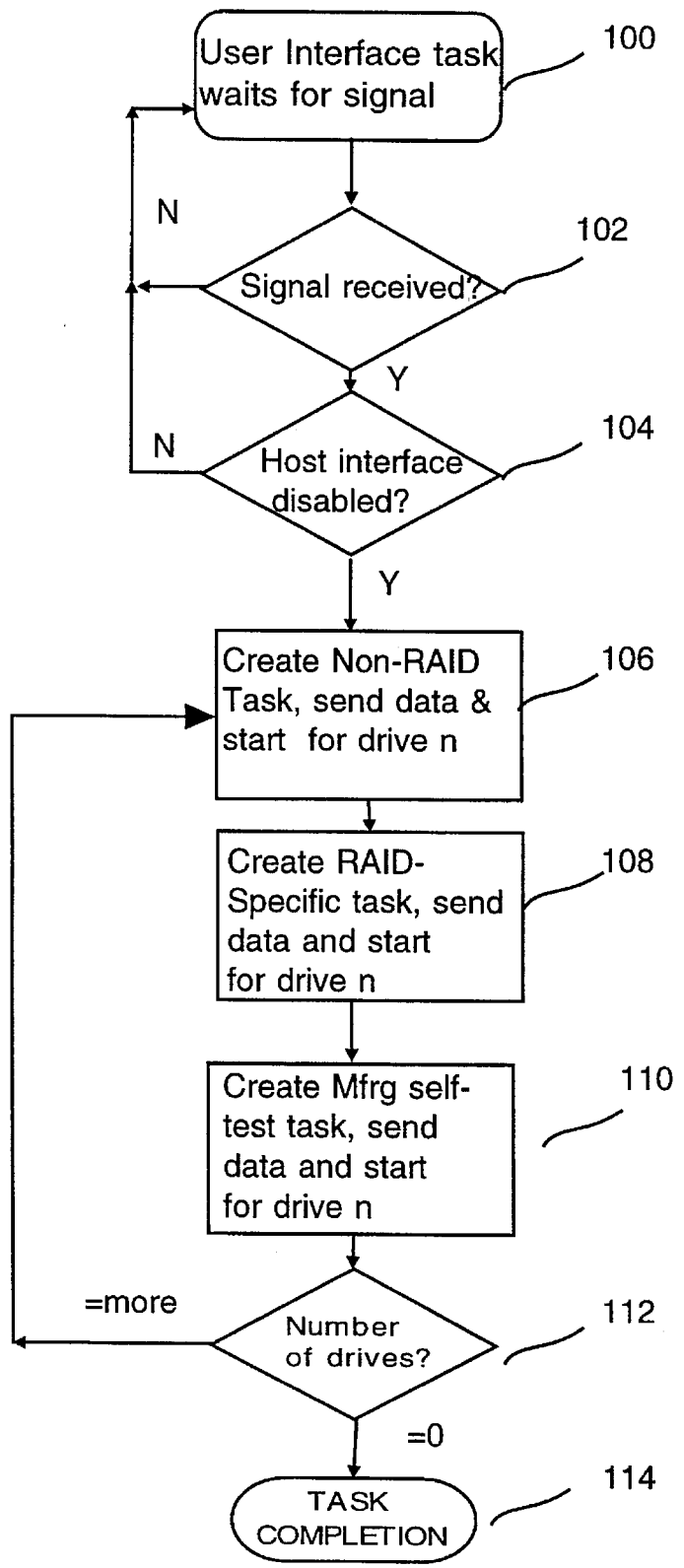
FIG. 2b is an overview flow diagram of the user interface task of the present invention.

Turning now to FIG. 2b, an overview of the logic of user interface task 81 is shown. At Step 100, user interface task 81 waits for a signal from the user interface device 80, although an initiation sequence could be transmitted through a conventional host interface, if desired. In a preferred embodiment however, testing is initiated through the user interface device 80.

In order to invoke the test, the user must be logged onto self-testing storage system 10 under an engineering password, and the host interface through input output processor 50 must be disabled.

After a signal has been received, at Step 102, the user interface task 81 verifies at Step 104 that the host interface has been disabled. This is to prevent testing from destroying any operations the host may have wished to preserve.

Still in FIG. 2b, user interface task 81 creates a Non-RAID specific task at Step 106, sends data to it, and readies it for execution. A RAID-specific task is created similarly in Step 108, and a manufacturing self-test task is created at Step 110. The manufacturing self-test task "oversees" the tests being done on the drive it was created for.

At Step 112, a preferred embodiment of the present invention checks to see if tasks need to be created for more drives, and if so, it loops through this process, going back to Step 106. If the appropriate tasks have been created for all drives, user interface task 81 returns to a wait status.

Figure 3:
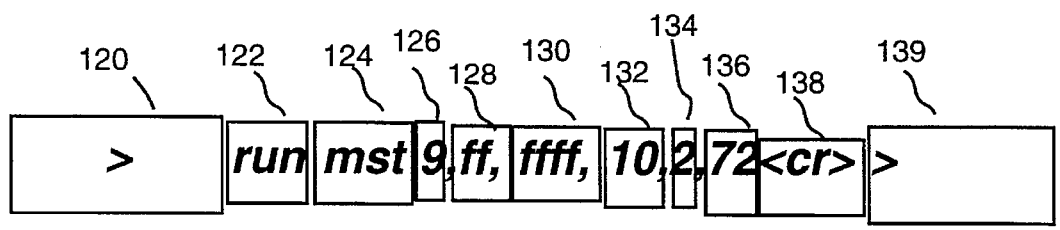
FIG. 3 is a block diagram of parameter syntax according to the method and apparatus of the present invention.

FIG. 3 illustrates one form of command syntax used in the present invention. Those skilled in the art know that other forms of syntax or command interface can be substituted to accomplish the same results. For example, while a preferred embodiment uses the command line interface shown in FIG. 3, a graphical user interface could be substituted on an appropriate user interface device 80.

Still in FIG. 3, following the prompt character 120, a run command, 122, appears. Taskname 124, here shown as mst, follows. The first parameter 126, shown here as a 9 (in decimal), denotes which of the several tests will execute. In a preferred embodiment this is actually a binary mask converted to a decimal number; the mask is made up of 12 bits, each representing a test. In a preferred embodiment, the most significant bit in the mask represents the cache multiple-pattern verification test, the second bit represents the cache single-pattern verification test, the third represents the butterfly-seek test, the fourth bit represents the multiple fixed-pattern test, the fifth bit represents the user-selectable single-pattern test, the sixth bit represents the sequential read/write test, the seventh bit represents the random read/write test, and the eighth, or, least-significant bit represents the command saturation test. For RAID-specific testing, bit significance can also be used to identify which RAID tests are to be run. The setting of any of these bits enables that respective test. Therefore, this first parameter has a range from 1 to 255, decimal. For example, if the user wanted to execute the sequential test and the saturation test, the mask might look like "00000 10 1" which would equate to a decimal "5". If more tests are desired, or a different association of bit positions in the mask is required, the size and the meaning of the mask is changed accordingly.

The next two parameters are hexadecimal values signifying the physical block address range on the disk which the test will cover. In a preferred embodiment, self-tests are performed over the full physical disk, with the exception of a maintenance code location. Of these two hexadecimal values, the first represents the starting address 128 for the test, and the second represents the ending address 130. In order to test the entire disk, minus the maintenance segment, the user enters a zero (0) as both parameters. It is a feature of the present invention that having these two parameters allows the user/tester to exercise an isolated part of a disk. In a preferred embodiment, user interface task 81 will not allow the starting block address to be higher than the ending block address. If the user does enter a higher starting address than ending, the maximum possible block address will be used as the ending point.

The fourth parameter is an iteration count 132, signifying how many times the overall test will run using the current parameter setup. If a zero (0) is entered for this parameter, a 'while forever' test loop is initiated, and the test will run until an error occurs or until it is halted.

Figure 14:
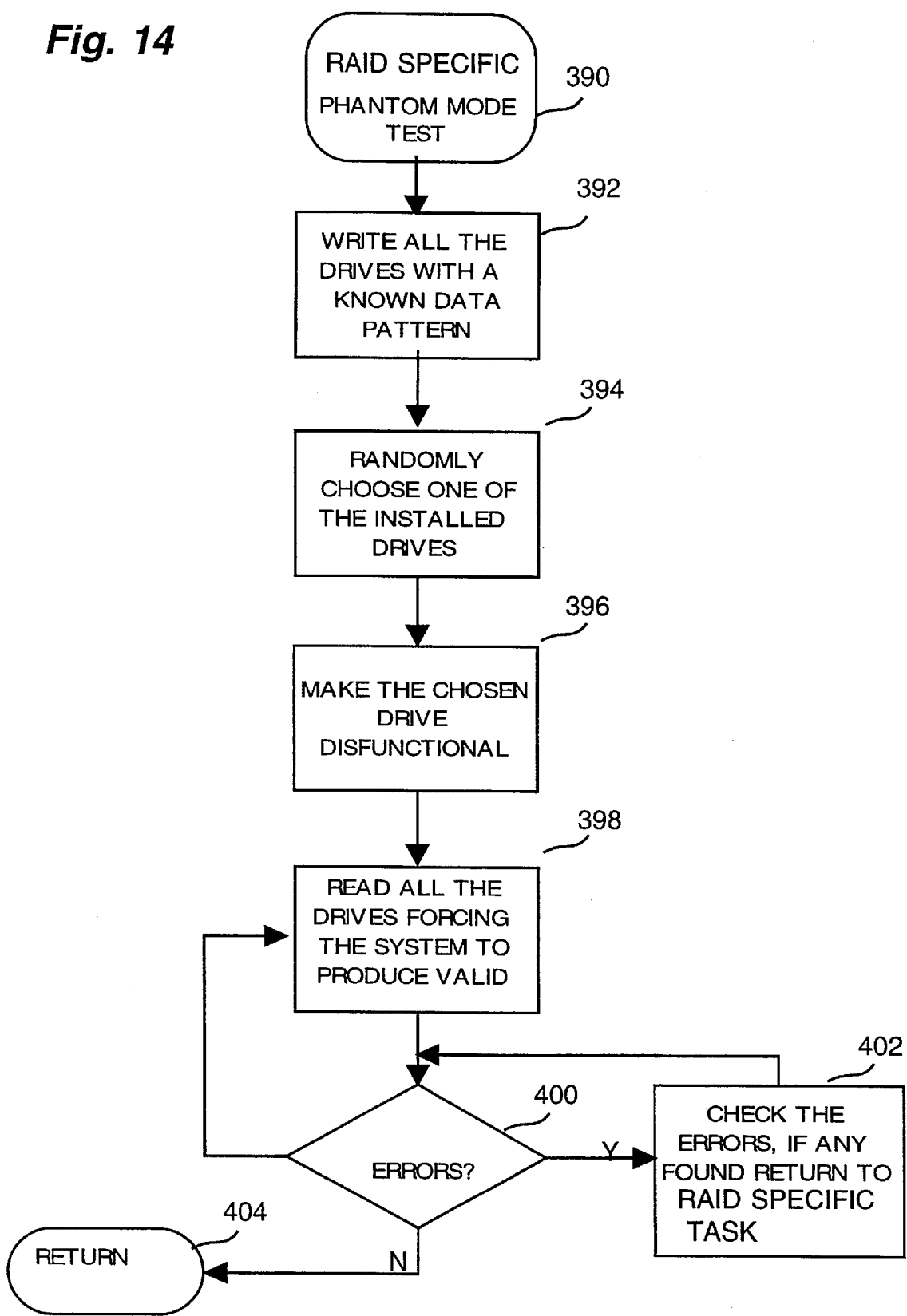
FIG. 14 is a flow diagram depicting RAID 5 phantom mode testing done by the present invention.

The next two parameters deal with the user-selectable pattern saturation test, in a preferred embodiment The fifth parameter, 134, is the number of nibbles (four bits) of the pattern which the user is inputting. This may be entered as any number between one (1) and eight (8). For example, if a decimal two is entered in this field, as shown in FIG. 14, the test will accept a 2 nibble pattern and replicate it throughout a bank of 8 longwords (any nibble combination repeats within 8 longwords); that array of longwords is then repetitively written over the block address range on the disk. The sixth parameter 136 is the actual pattern which the test will utilize. The test will only utilize the number of nibbles specified in the field before; any extraneous entries will be ignored. This pattern is supplied in a hexadecimal format. If the fourth test is not selected, using the appropriate test code, then the user may simply enter zeros for these three parameters (anything entered is ignored). The end of the parameter list is indicated by a carriage return 138.

In a preferred embodiment, when self-testing storage system 10 is powered-up for testing, all of the global variables and message and log structures associated with the self-test of the present invention are reset and/or cleared. Upon an invocation though the user interface device 80, user interface task 81 initiates basic self-testing and limit-checking, by passing all parameters as dictated by a task command parser. In a preferred embodiment, user interface task 81 initializes, at run time, a number of tasks and queues as shown in FIG. 1b. For the manufacturing self-test tasks, the number created is equal to the number of active, physical drives within the system being tested. There is one active task per physical drive. This task/queue create function in user interface task 81 also insures that there is no dual-id task creation and that a self-test is not already running for a particular drive 5.

In a preferred embodiment, if a test is currently running on a drive 5, when the user tries to start a Non-RAID specific or RAID-specific task for that same drive, the second request to start will be rejected, notifying the user that the test is already running. If the test is not already executing, the user interface task 81 will first initialize all flags to the appropriate values and partition the cache available between the active drives. At this point, a loop will be executed which, for each active drive does the following: creates a task/task-id and queue/queue-id; sets up an information structure, to be sent to this task, which is comprised of such data as user-selected parameters, a pointer to a cache list, and any other information which will be needed to execute the tests on the drive; and finally, sends the information structure to the current drive task through a pSOS pipeline ('qsend') in order to awaken the task and start the test.

The pSOS 'qsend' passes the setup parameters entered through user interface device 80 to each existing task. These parameters will be received and interpreted by each Non-RAID specific task, and RAID-specific task. For example, a Non-RAID specific task actually cycles through each of the Non-RAID specific tests, invoking those which are specified by the input parameters. As each of these individual tests is called from a Non-RAID specific task, it is passed the necessary parameters.

Figure 4:
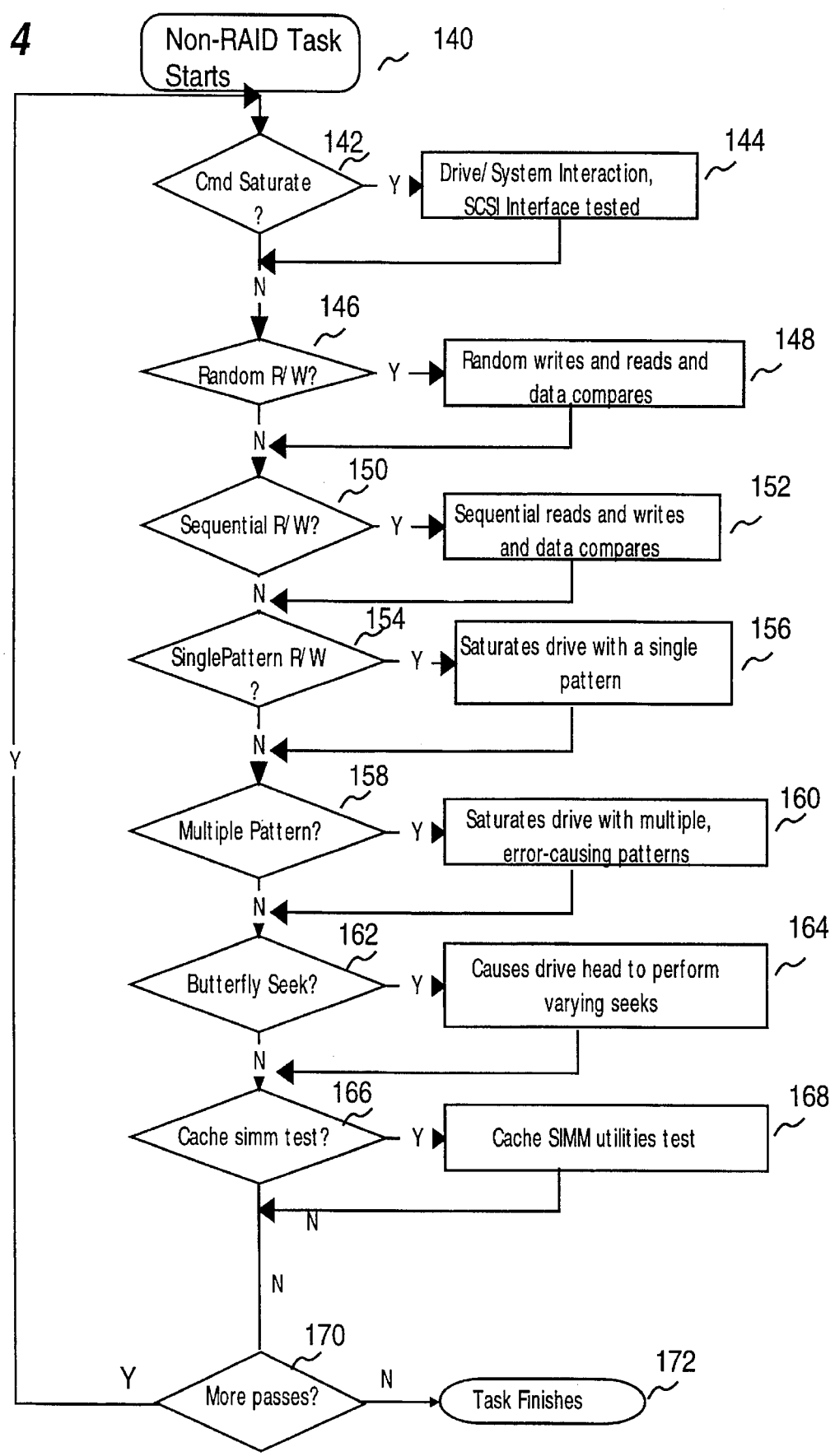
FIG. 4 is a flow diagram of a sequence of non-RAID specific tests, according to the present invention.

FIG. 4 depicts such a flow through a Non-RAID specific task. As will be apparent to those skilled in the art, rather than create two subtasks, one for RAID-specific testing and one for Non-RAID specific testing, another implemention might combine all functions into one subtask, provided cache lockup for error reporting is handled properly.

Figure 9:
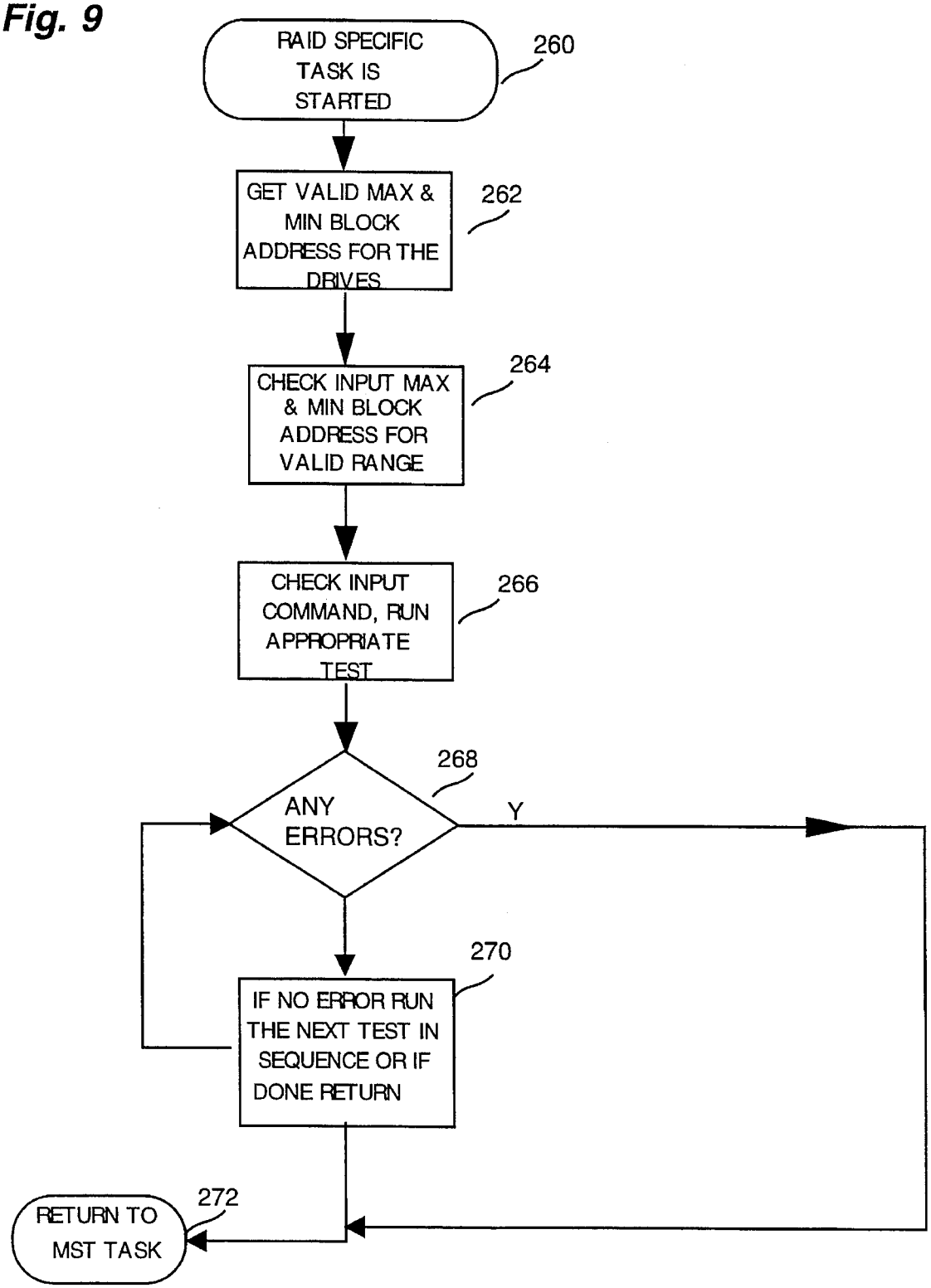
FIG. 9 is an overview flow diagram of block range analysis according to the method and apparatus of the present invention.

For random access systems being tested the first action performed under each test is that of determining starting and ending block addresses. This is shown in the flow diagram at FIG. 9. The addresses used are based upon what the user requested, as depicted in FIG. 3, coupled with the storage system's own knowledge of what is actually available, in so far as disk boundaries are concerned.

Figure 5:
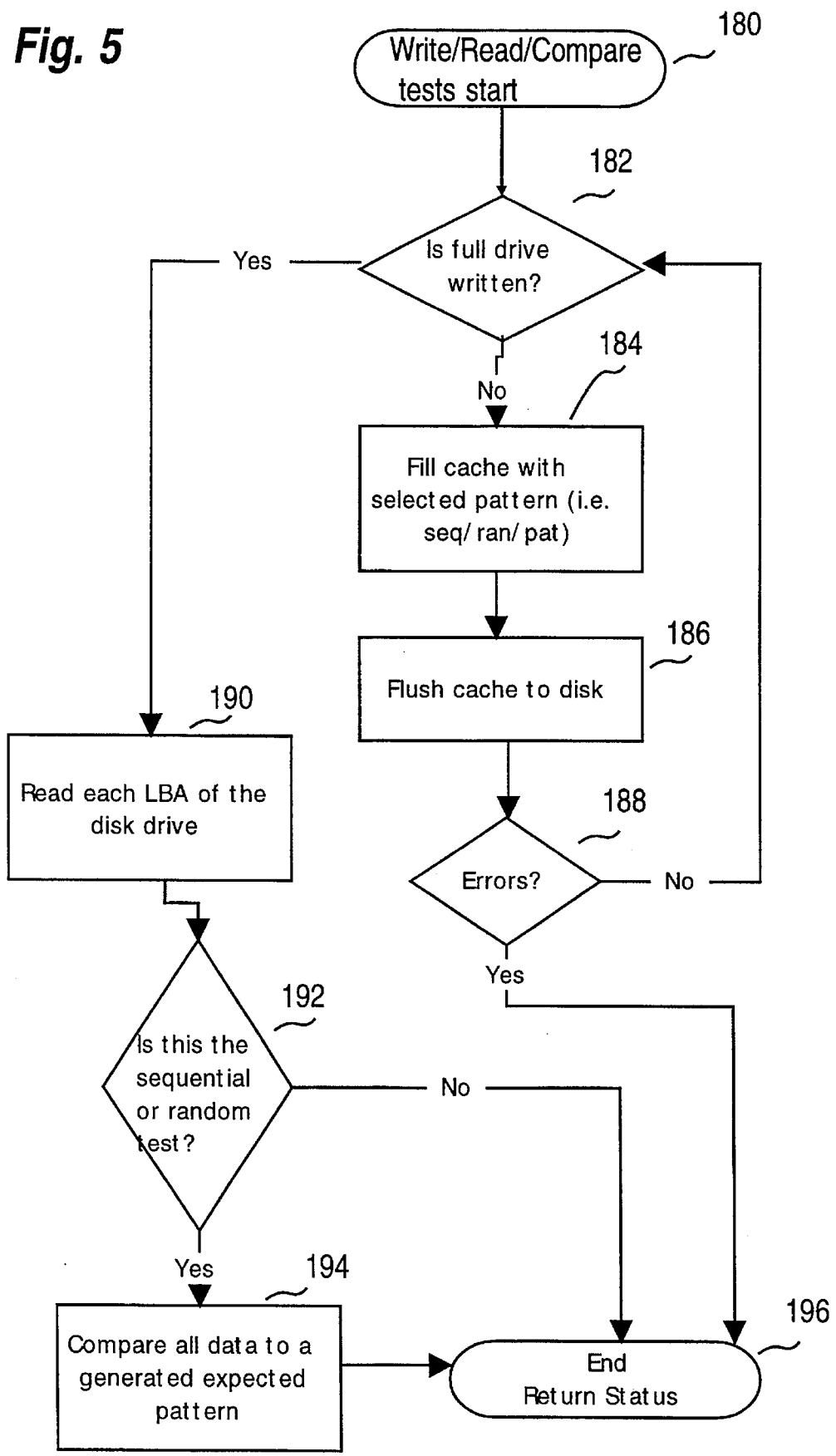
FIG. 5 is a flow diagram of sequential, random and pattern write/read/compare testing according to the method and apparatus of the present invention.

Turning now to FIG. 5, a flow diagram of both sequential and random read/write Non-RAID specific testing for a disk storage system is illustrated. The sequential read and write test operates over the starting and ending user-inputted block addresses. If this is the first test called, its initial task is to set up a data pattern in cache for as many writes as possible within a drive's allotted cache space. The data pattern is determined on a block-by-block basis.

In a preferred embodiment, the first longword of the block is a concatenation of the port, drive and block address. The remaining longwords within the block (block size may vary among systems) will simply contain a number which correlates to that longword's position within the block; for example, the second longword will contain the integer value zero (0), the third will contain a one (1), etc., until the last longword is reached. Each read and write is of a predetermined block count. Each time a new block of the data pattern is to be written, the first long word of the block is incremented—i.e. the block address segment of that first longword concurs with the disk location it is being written to. Once the maximum cache available to each drive has been filled with this pattern, as shown in Step 184 of FIG. 5, the cache segment is written to the disk, beginning at the user specified block address, as shown in Step 186. The pattern in cache is then modified—the first longword of each block is incremented in keeping with the predetermined pattern—and again the cache is written to the disk. This process will be repeated until the entire drive has been written with this sequential pattern.

Once the disk is full, data is read back into the cache area, at Step 190, in FIG. 5, starting with the first address on the disk which was previously written. A data compare is then performed at Step 194 between the expected data value (or pattern), as calculated "on the fly", and the actual value as read into cache.

This process is repeated until the entire drive has been verified. In a preferred embodiment, this test recalculates and reassigns longitutidinal redundancy check (LRC) values as it is writing the address range.

In the case of a data miscompare the test is halted and the error is logged in the master log. A typical error log entry, shown in FIG. 15*a* contains the following information: the port and drive on which the error occurred; the cache address at which the mismatch was found; the expected pattern, as generated during the compare stage; the block address at which the mismatch was detected; and the actual pattern which was read from that block address. As is standard with error logs, a time-stamp also accompanies the above information. Any other hard media errors will also halt the test, and will be logged as dictated by self-testing storage system 10's normal error handling routines.

Returning to FIG. 5, In a preferred embodiment a random read and write test exercises the drive interface, the drive media, the controller cache and approximately 80% of the controller hardware. In a preferred embodiment of the present invention, the main purpose of this test is to make as many disk accesses/verifications as possible in as little time as possible. In this embodiment, the setup for this test includes preparing the cache ahead of time with sixteen writes, each with a random block address and block count. These writes are all executed before any data comparing is performed, entailing greater speed of access and therefore higher stress on the drive interface. The cache available per drive, for this test, is broken up into two areas: one area is for setting up writes and retaining them for later compares, the other is for receiving data from subsequent reads which is used to compare the writes.

The block count and block address for each write is determined randomly for each write operation. In one preferred embodiment the block count is within a range of 1 to 64 (decimal) blocks per write. The block address range spans the physical disk boundaries, minus a section which houses the maintenance partition. To insure full address space coverage, the available disk space is split up into several areas, depending upon the user-inputted address range. If the desired range is greater than 800 (hexadecimal) then the test module will divide it into 16 different areas, and one write/read will be instituted on a random block address within each area. If a range of less than 800 (hexadecimal) is requested, the number of divisions will decrement accordingly. As an added check, if the input block address is less than 80 (hexadecimal), the test will default to 80 (hexadecimal) as an address space size. This is to insure a large enough address space for one write operation of up to 64 (decimal) blocks. The pattern used for this test is somewhat similar to that used in the sequential test. Each long word written is a concatenation of the port, drive and block address of the block being written. The difference here, though, is that each longword is incremented by one, in the setup pattern.

Still in FIG. 5, as soon as all sixteen write accesses have been completed, the code will institute a data compare process between the two cache areas. Any hard errors or data miscompares encountered will cause an immediate halt and be logged in the master log, in the same manner as the sequential test. This entire process will be repeated for each of the iterations which occur within this test—360 iterations in a preferred embodiment. As in the sequential test the LRC is recalculated and reassigned whenever a write is performed.

Figure 6:
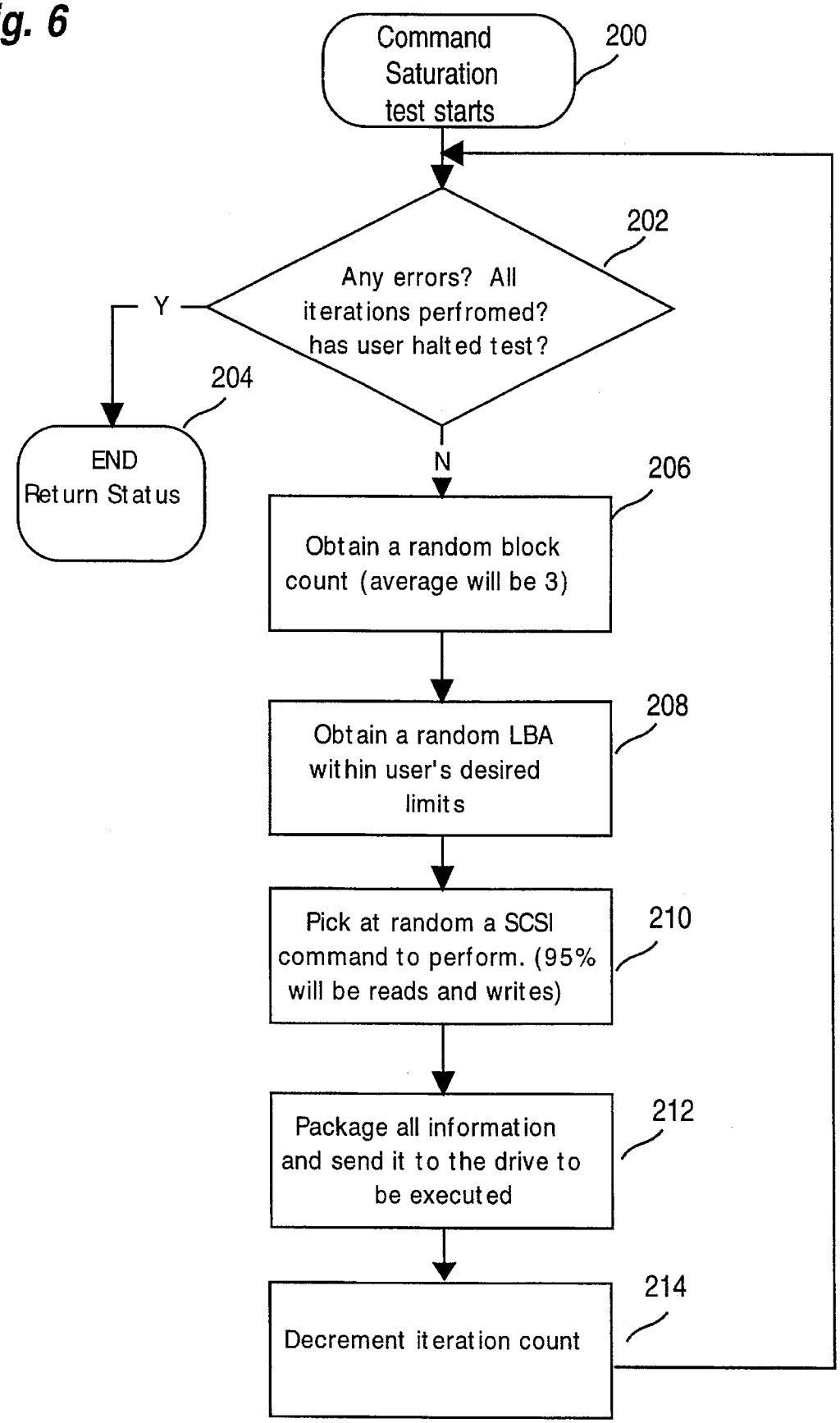
FIG. 6 is a flow diagram of command saturation testing according to the method and apparatus of the present invention.

Now turning to FIG. 6, the flow of command saturation testing is shown. In a preferred embodiment of the present invention, the objective of command saturation is to stress the interface between the drives and the controller board. This is accomplished by forcing the drives to perform as many commands as possible in a specified time. During this time period, approximately 150,000 commands are issued to each of the drives, In a preferred embodiment. As shown in FIG. 6, the disks under test use SCSI protocol, so SCSI commands are issued. The commands which are dispatched to the drives by this test include test unit ready, read, write, read long, write long, rezero, verify, write verify, and a power seek command (which is a read followed by another read ⅓ of the disk away). Any hard media errors encountered in command execution will suspend the test and be logged, in accordance with the normal controller error handling.

In a preferred embodiment, within each of the 100,000 iterations of this test, a command is chosen at random, at Step 210, along with a random block address (Step 208) and a random block count (at Step 206). In this embodiment, the test imposes that 95% of the commands chosen will be reads or writes (52% reads, 43% writes) and that the average block count will be 3. These constraints were chosen based upon which SCSI commands are most common—reads and writes—as well as the most common number of blocks which are acted upon by these commands. The block address determination follows the same constraints as in the random read/write test.

LRC calculation is not an issue within this test, regardless of the product type. Each time a write or a write long is performed, the test will first execute a read or read long, to insure that the same data is re-written at the same block address.

As indicated by decision block 202 in FIG. 6, the execution of the self-tests may be halted by the user with a halt command. In a preferred embodiment, this command flags the user interface task 81 to allow whichever test is currently executing to finish, and then to invalidate any other further tests or iterations from occurring, suspending testing and returning to the command prompt. If this halt command is entered by the user when the test is not running, a message will be returned informing the user of this. As a precaution, while the test is executing, any other commands which may require the use of the cache-area, and therefore interfere with the test are disabled; for example, a "dump defect list" command which is entered before the test has finished or been halted will not be carried out, and the user is notified of this.

The user-selectable pattern saturation test works in much the same way as the sequential read/write test shown in FIG. 5 with two exceptions: the pattern written over the selected block address range is determined by the user, and the data written is not verified when it is reread. This serves to exercise the drive media, saving time by not performing a comparison of a repeating pattern. The pattern which the user wishes written across the drives is signified upon the command line, at the time of self-test execution. In a preferred embodiment, the user's desired pattern may be anywhere in length from one (1) to eight (8) nibbles. The input pattern will be replicated and thereby promoted to a longword format which can be written over the address range. The cache usage, data writes and data reads are performed in the same manner as the sequential test, shown in FIG. 5. Once the full disk address range has been written, the data will be read back from the disk. Any soft errors will be tabulated in the log, and any hard errors will suspend activity on that drive. As in the sequential test, the appropriate LRC will be assigned to each block as it is written to the disk.

Still in FIG. 5, it can be seen that the multiple fixed-pattern test operates in much the same way as both the sequential read/write test and the user-selectable pattern test do. In fact, this test is simply a hard-wired looping of the user-selectable pattern test, with 8 different patterns substituted in, one on each loop. There are no data comparisons performed within this test; its purpose is to test the disk media only. Any errors encountered during this test are logged; hard errors will cause the problem drive to halt, soft errors will not.

In a preferred embodiment, within the fixed-pattern test (as well as the user-selectable pattern test,), any patterns which are less than 8 nibbles in size will be filled across the appropriate number of longwords. That block or bank of longwords is then written across the drive. This is to avoid having to pad these patterns with zeros and thereby nullify their effect.

Figure 7:
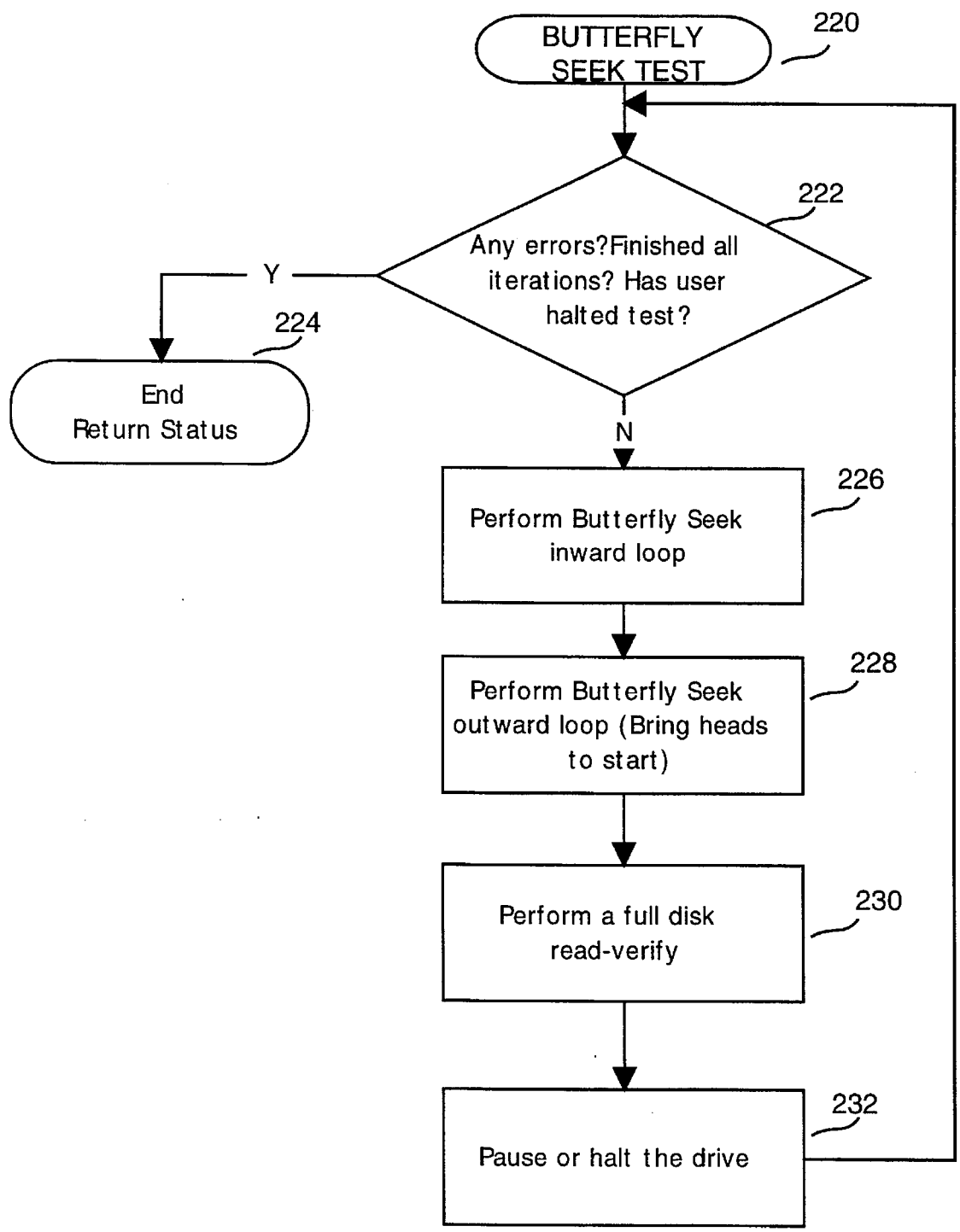
FIG. 7 is a flow diagram of butterfly seek testing performed according to the present invention.
Figure 8:
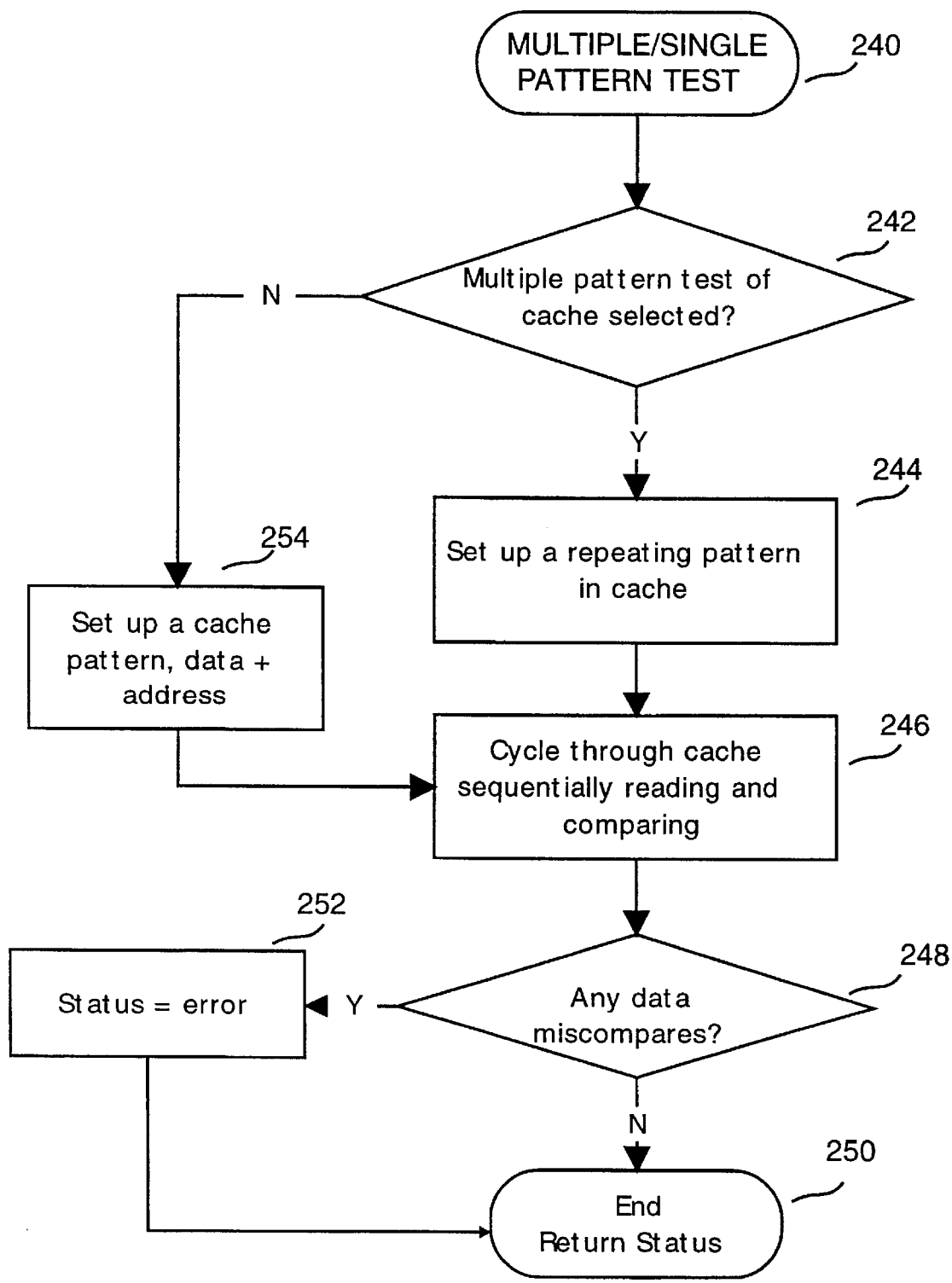
FIG. 8 is a flow diagram of a multiple/single pattern test performed according to the method and apparatus of the present invention.

Turning now to FIG. 7, the butterfly-seek test logic used to exercise a disk drive 5's internal, mechanical parts is shown. The head-to-platter interaction may best be tested by forcing several seeks repeatedly. Within this self-test, the butterfly seek causes the drive to do just that. A seek is performed, first at the minimum physical block address, Step 226, and then at the maximum block address, Step 228, (both as selected by the user). The next two seeks are then performed, one at the minimum address plus forty blocks, the other at the maximum address minus forty blocks. This process continues, until the min/max boundaries have been reached, at which point the directions of the block increments/decrements is negated.

In a preferred embodiment, once the entire address range has been covered, in both directions, the drive is paused momentarily at Step 232; the entire process is then repeated two more times. Any errors encountered during this test are handled by the normal system error handling routines after being logged as soft or hard errors.

Figure 10:
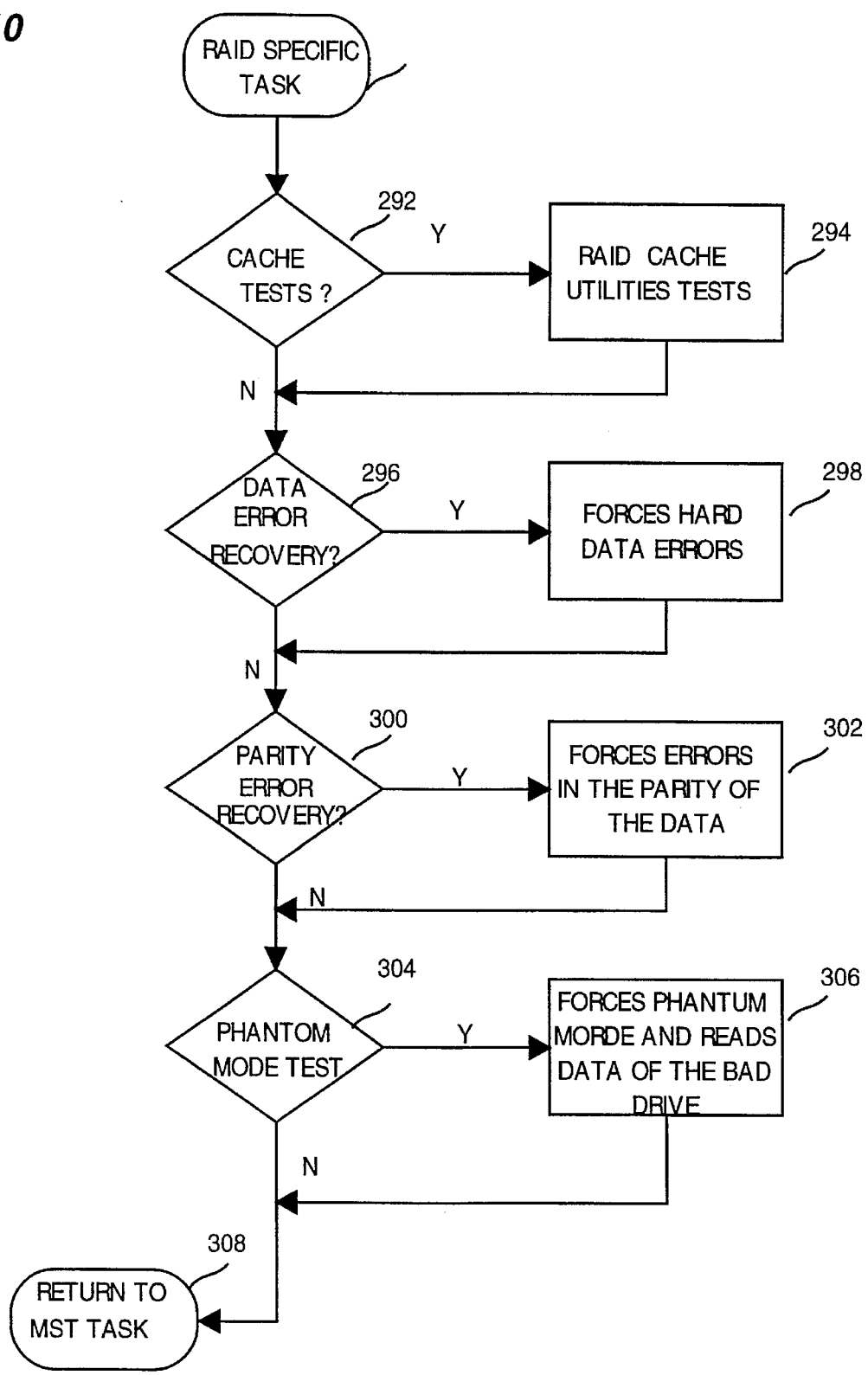
FIG. 10 is a flow diagram depicting a sequence of RAID-specific testing by the present invention.

In a preferred embodiment of the present invention, RAID specific tests are implemented. A sequence flow for these is shown in FIG. 10. As with the Non-RAID specific tests, the RAID-specific test are also used as a part of the software design verification testing for the self-testing storage system 10.

Still in FIG. 10, it can be seen that the RAID-specific tests include four tests which test the functionality of the on-line system code. The first test is a data-corruption test which uses the system write and read tasks and all the host accessible host block addresses on the drive. This test sequentially writes the drive, randomly corrupts data blocks, causing hard media errors, on the drive. Then it reads the data back from the drive and performs data compares to test the data reconstruction utilities of the system code. The second test is the parity-corruption test. This test sequentially writes the disk and randomly corrupts the parity blocks. The test sequentially writes the disk again forcing the system to detect and regenerate the correct parity from the data, then it reads the data of the drive and performs data compare to ensure the data integrity. The third test is the phantom mode test. In this test power is turned off for a randomly chosen drive after writing the sequential data to it. The data is then read back from all the drives to test the system code for providing the data for the bad drive. The fourth test has nine sub-tests, in a preferred embodiment, which are designed to test the cache utilities of the on-line system code. The RAID-specific tests are executed by the RAID-specific task.

Figure 12:
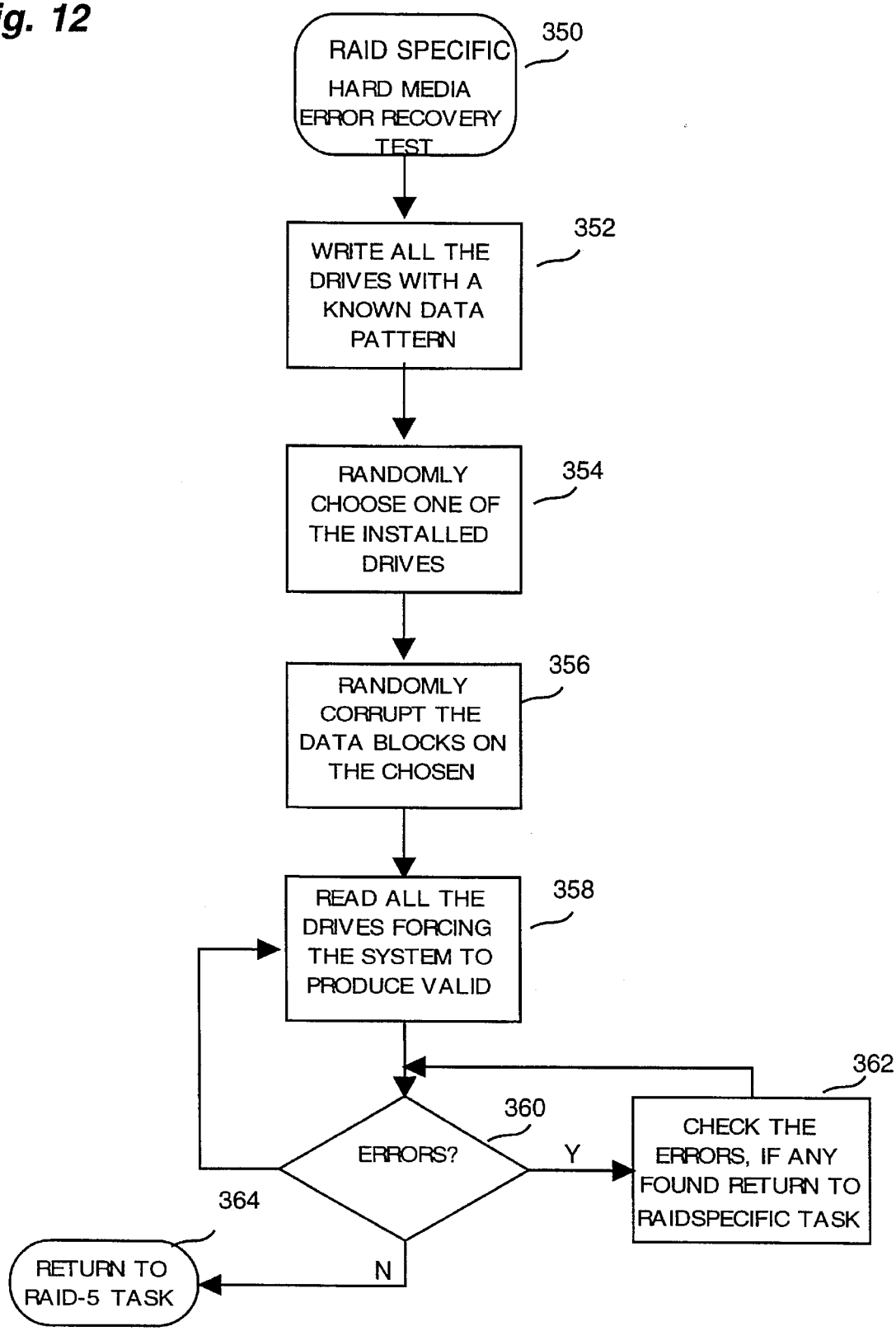
FIG. 12 is a flow diagram of RAID-specific data corruption testing according to the method and apparatus of the present invention.

Turning now to FIG. 12, the RAID-specific task causes the data corruption or hard media error recovery task to run at Step 350. At Step 352, all drives are written with a known data pattern. Data corruption is forced on only one of the on-line drives. In a preferred embodiment, the target drive is chosen randomly, at Step 354. A comparison is done to check if the drive id on which the test is running matches the id of the drive selected randomly for data corruption. If it does, the test divides the given lba range, for the particular drive, with a constant (2880). Depending on the input lba range this will divide the drive in 1 through 16 divisions, to ensure that the corrupted blocks are not very close to each other.

After the drive has been divided into different regions, a function is called as many times as there are regions, to get a random lba in every region. This ensures that the random lba's are not very close to the respective region boundaries. At the end of this process the hard data error test calls the function corrupt data parity blocks, with a pointer to the random lba array, which then corrupts the data blocks at Step 356. The test then performs reads at Step 358. The reads are performed following the same procedure as explained for the writes earlier. The only difference is that the functions are called with the read commands, and the data is compared. The data compare is performed to ensure that the system on-line RAID code detects the data corruption on one of the drives and reconstructs the corrupted data.

In case of a data miscompare, an error flag is raised. All the tests on every drive are stopped and the data miscompare error is recorded into the master error log. The error log contains the following information for the miscompare, "target id", "expected data", "test number", "Lba" and the "cache address". The format of the error log is shown in FIG. 15*a*.

Figure 13:
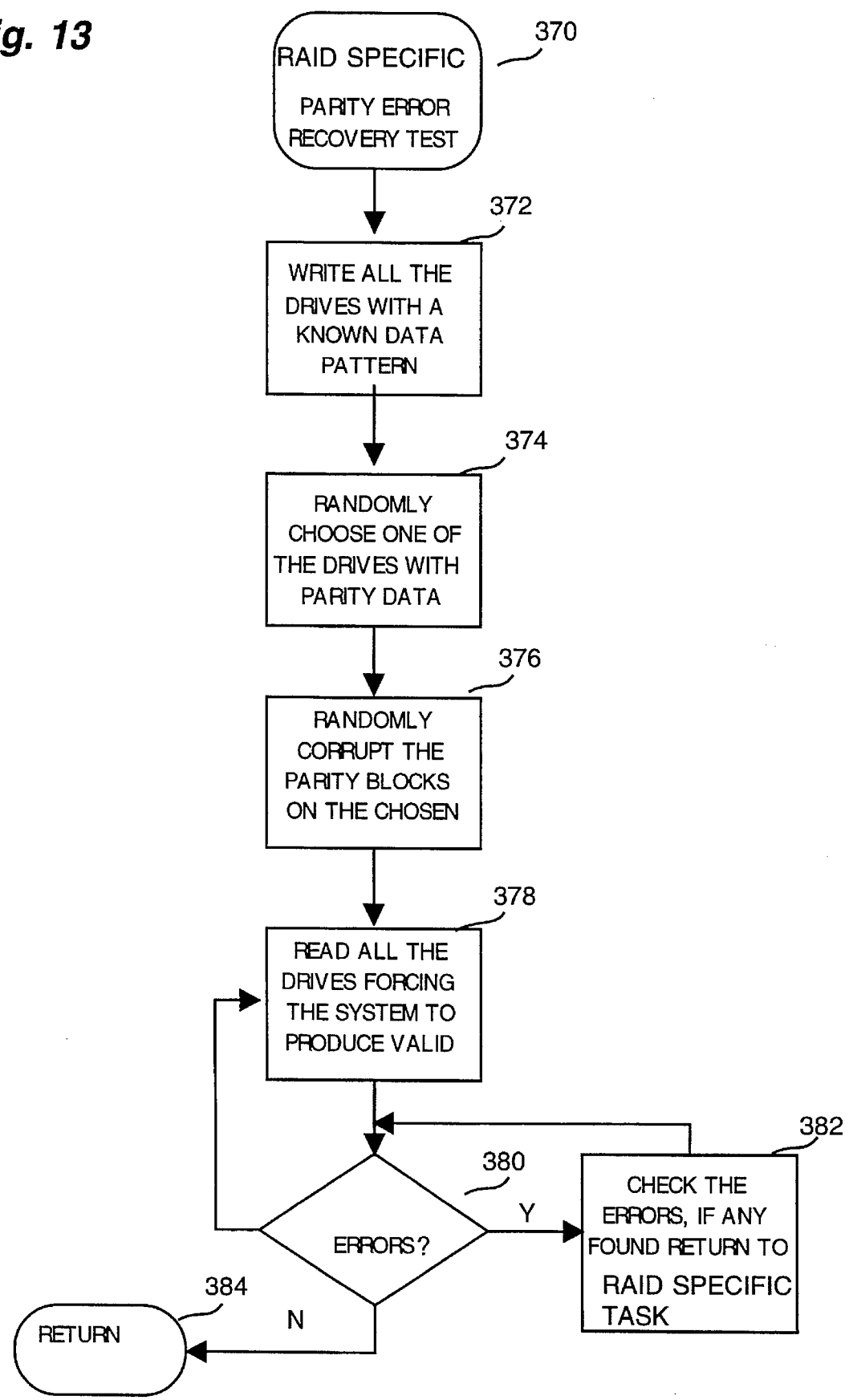
FIG. 13 is a flow diagram depicting RAID-specific parity error recovery testing according to the method and apparatus of the present invention.

With reference now to FIG. 13, parity error recovery testing is done by corrupting parity blocks for the data of a randomly chosen drive. The random target drive is not the same drive which is used in the "hard media error recovery test". The RAID-specific task ensures that the drive ids are different for different error recovery tests. This test follows the same process for getting the random lba's as the "hard media error recovery test". However this test makes the call to "corrupt data parity blocks" function with the corrupt parity flag asserted. This flag forces the test function to make an extra function call to get the parity location associated with the lba's passed to it. Then, the parity blocks are corrupted. After doing so the test rewrites the drive for the given lba range and when done writing, it reads the data from the drive at Step 378 and performs the data compares for the data read at Step 380. The data compare ensures the on-line system RAID code is able to detect parity error during the writes after the parity corruption, and is able to reconstruct the parity from the data in the drive. On the other hand a data miscompare signifies the system is not able to recover from the parity error and in this case the data miscompare error is recorded into a master error log entry as shown in FIG. 15*a*.

Next, FIG. 14 shows the phantom or failed drive test. The purpose of this test is to force the subsystem to run with a bad drive. This will help determine if the system on-line RAID code is keeping multiple copies of the host data for one drive on the other on-line drives installed in the subsystem. First, the drive is written with a known data pattern, at Step 392. A drive is chosen at random, to be powered off, at Step 394.

The test then calls a power off function which removes the power of the target drive at Step 396. If the user doesn't wish to have the drive powered down, the test can also be written to remove the device from those tables of the storage system 10 that indicate it is present. Whichever method is selected to eliminate the drive, the test then reads data back from the drive, at Step 398 to ensure that the system can still provide the data for the bad drive and the data compares performed ensure that the data is correct. In case of the miscompare the data error is recorded in the master error log.

Now, in FIG. 12, it can be seen that the fourth major RAID-specific test is the cache utility test. This test is further subdivided into nine sub-tests which force the subsystem into different scenarios to test the functionality of the cache code. Following is the order, along with the descriptions, in which the cache utility tests are run in a preferred embodiment of the present invention.

In test one, at Step 314, a double cache write is used to test the cache utility for handling two versions of the same block in the cache. This is performed by getting a random lba and issuing two host write commands for the same lba without giving the controller's CPU any time to process the first write before the second write comes in. The data block for the first write is setup sequentially and the data block for the second write is incremented by one (1). To ensure that the correct data block is in the drive, data compare is performed for the data block used in the second write.

In test two, at Step 318, a double cache write with raid write finishing before the second host write finishes is performed. This test forces the cache utilities to a state where the host issues a write command for a randomly chosen lba on the drive. Raid write starts to process the data in the cache and, at this point, the host issues another write command for the same lba and puts the data in the cache. However this test is designed such that the raid write task finishes before the host is done putting data in the cache for the second write. At the end of this process a data compare is done with the block used for the second write and any miscompares are logged into the master error log.

For test three, at Step 322, a double cache write is done with host write finishing before the raid write is done processing the 1st write. This is the same scenario as the previous test, except that the Raid Write Task is given less time to process the first write so that the host second write comes in and finishes before the Raid Write Task is done processing the first write.

Next, in test four, at Step 326, a double cache write is done with a third host write before the raid finishes processing the first two writes. This test puts three versions of a data block in the cache to test the old, new and newer functions of the cache utilities. The test issues two host writes for a random lba. The second write is done by incrementing every long word in the block by one. After finishing the two writes the test gives the controller CPU enough time to start processing the pending writes before the test issues the third write for the same lba again the contents of the data block are incremented by one. A data compare is performed for the data written in the third write to ensure that the correct data was written to the drive.

Figure 11:
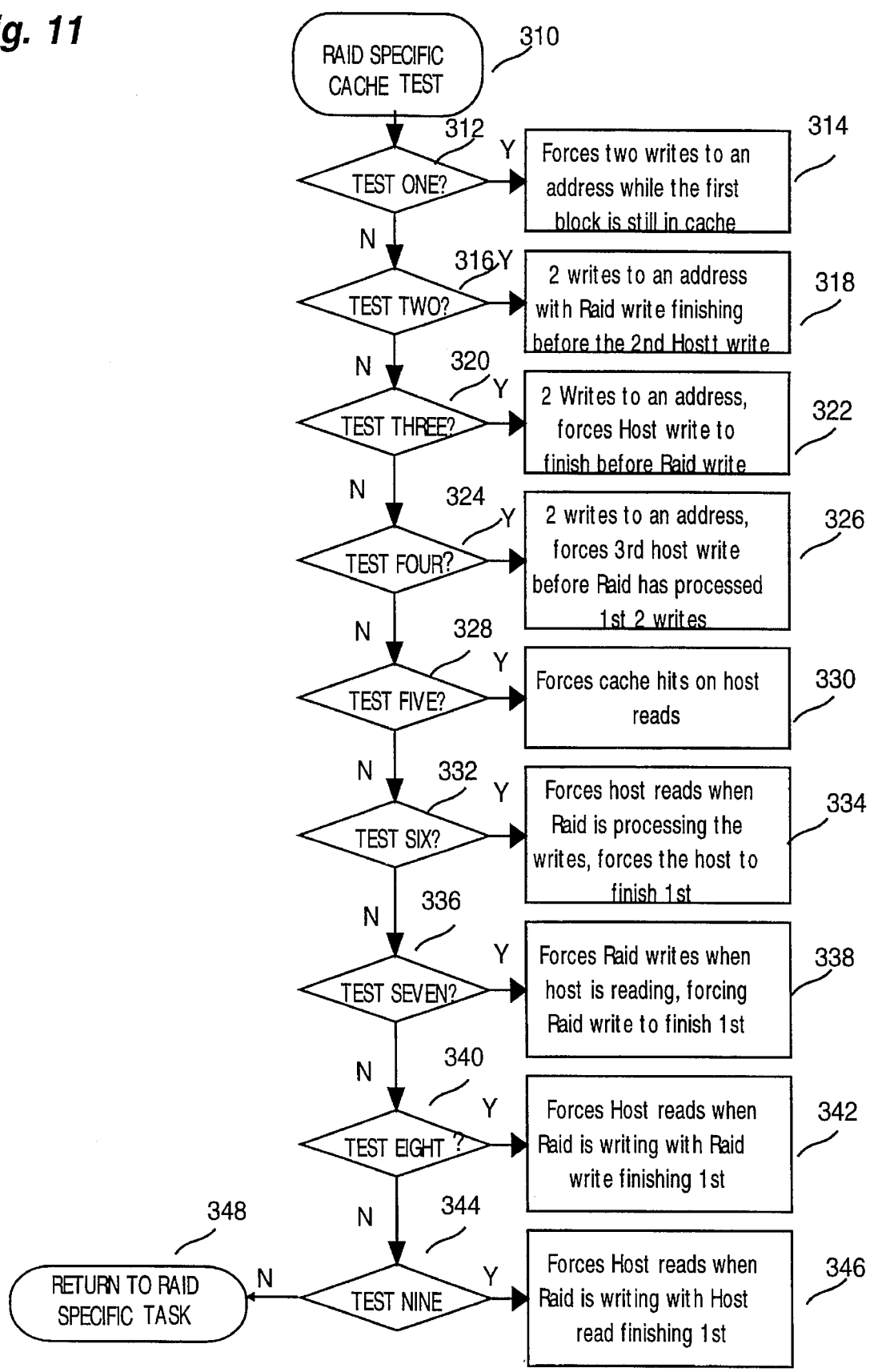
FIG. 11 is a detailed flow sequence of RAID specific cache tests according to the method and apparatus of the present invention.

Sill in FIG. 11, at Step 330, test five, a host read with cache hit is performed. This forces non-volatile cache hits for the host reads. In this test the host issues a read command immediately after it has issued a write command for a random lba.

Next, at Step 332, test six simulates the situation where the host is reading and raid write starts with host finishing the read first. In this test the host, starting at a random lba, is treated as issuing a write command for sixty four blocks. The test then simulates the host issuing the read command for the same data blocks. However before finishing the read, the host "pauses" for a small interval just to start the Raid Write process. The interval is barely enough for the Raid write task to start processing the data in the write cache before the host completes the read.

The next Step 338, test seven, simulates the host as reading, while a RAID write starts with RAID finishing the write first. This is the same situation as described in the previous Step 334, however in this test the host, during the read, the test pauses for a long enough time interval for the controller to finish the write before the "host" finishes the read.

Still in FIG. 11, at Step 342, test eight, the scenario is created in which the RAID system is writing and host starts reading with RAID finishing the write first. This test forces the cache into a state where the host has finished the write command, the RAID write task starts processing the data while the host issues the read before the RAID write is finished. However the RAID write finishes the write process before the host finishes the read.

Finally, at Step 346, test nine, the situation is tested in which RAID is writing and host starts reading with host finishing the read first. This is almost the same test as the previous Step. However this is designed so that the host read finishes before the raid write task is done with the write process.

Other commands are instituted as a part of the self-testing process. In a preferred embodiment two additional commands are included, namely:"show" and "clear." None of these commands take any parameters as input, and each is invoked from the command prompt. The system must be disabled and the user must be logged on at the engineering-level password. In addition to these commands, a preferred embodiment of the present invention can use "show all" and "show trace" commands provided by non-self-test functions of the storage system when observing the test's results.

During the execution of the RAID-specific task the status of the tests is stored in a data structure. When a show command is entered at the prompt user interface task 81 calls the show function which formats the information stored in the status data structure and displays it on the user interface device 80. The information displayed contains the number of iterations for each test, hard errors if logged, the status of the test (runrag or stopped) and the test which is currently running. In addition to this the show command also displays the start and end times for the execution of the RAID-specific task.

At any point during the execution of either Non-RAID specific or RAID-specific task testing, the tests can be halted by entering a halt command. When this command is entered the execution of all the tests is halted immediately.

At the time of execution for the user interface task 81, a log entry in the format as shown in FIG. 15*b* is created in memory which will be used to store information on the test. This log keeps track of the following, for each port and drive: the number of sequential, random, saturation, pattern and butterfly test iterations which have occurred while the test has run; the number of hard and/or soft errors which have occurred; whether or not a manufacturing self-test task subtask is currently running; and, if it is running, which test it is currently executing. Additionally, this log contains a timestamp table, which, for each drive, states when the test was started and when it ended. If the test has not ended, the log reflects that. To view this information, a command must be entered at the prompt.

The logs may not be cleared while a test is running, so the clear option is disabled until a "halt" is entered or until the full test is complete.

Error handling of self-testing storage system 10 varies for each of the tests. As was discussed briefly above, a data miscompare for the sequential read/write or random read/write test will result in a log entry in the master log, as well as a halting of the test. A data miscompare in either of the cache verification tests results in the same. A hard media error which occurs in any of the tests will cause suspension of the test and an increment in the number of hard errors as logged in the log entry structure. Any soft errors which are detected will also be logged in this structure, but will not terminate execution of the test.

The format of the data miscompare errors as they appear in the master log is shown in FIG. 15*a*. The port number and drive number of the drive on which the miscompare was found is denoted as "a" and "b" in FIG. 15*a*, respectively. The cache address of the data read in which is in question is denoted by a hexadecimal value, "cccc, cccc." The expected value of the data, as calculated at compare-time, is located in the field denoted by "dddddddd", a hexadecimal number. The block address on the drive of the block which contained a different pattern than the expected is specified by a hexadecimal value, "eeeeeeee." And finally, the actual value which was read at that block address is found in the field denoted as "ffffffff", again a hexadecimal number. As in any error log, a time-stamp of the error occurrence is also included.

There are many options and combinations available when invoking the manufacturing self-test. In one preferred embodiment used in the burn-in process the tests are run across the full available block address range and are set to run until halted (i.e. no number of iterations dictated). In this configuration, the multiple fixed-pattern, command saturation, random read/write and sequential read/write, tests are run, and in that order.

As will be apparent to those skilled in the art, the exact tests and number of iterations selected will depend on the nature of the devices contained in self-testing storage system 10.

It will be apparent that modifications and variations can be made by those skilled in the art without departing from the spirit and scope of the invention.

What is claimed is:

1. An apparatus for performing self-testing in a storage system, comprising:

a controller for activating physical devices of said storage system, said controller having a microprocessor, a memory, a host interface and at least one input/output processor;

a user interface device connected to said controller, said user interface device having a signal transmitting/receiving capability;

a designated location within said storage system for holding pre-recorded test sequences;

user interface logic operating within said controller for acting upon signals from said user interface device to cause said controller to transfer said pre-recorded test sequences into said memory of said controller for execution, so that said pre-recorded test sequences can be executed in said storage system, thereby performing self-testing.

2. The apparatus of claim 1, wherein said user interface logic includes an analysis mechanism for analyzing the information conveyed by signals transmitted from said user interface device, to determine which of said pre-recorded test sequences to run.

3. The apparatus of claim 2, wherein said user interface logic comprises a logic circuit encoded in an integrated circuit chip residing within said controller.

4. The apparatus of claim 2, wherein said user interface logic comprises a software program brought into said memory of said controller from a physical device of said storage subsystem.

5. The apparatus of claim 1, wherein said pre-recorded test sequences include tests for random access storage devices.

6. The apparatus of claim 5, wherein said tests for random access storage devices include random write, read and compare tests.

7. The apparatus of claim 5, wherein said tests for random access devices include butterfly seek tests.

8. The apparatus of claim 5, wherein said tests for random access devices include cache tests.

9. The apparatus of claim 1, wherein said pre-recorded test sequences include RAID specific tests for random access storage devices having RAID features.

10. The apparatus of claim 9 wherein said RAID specific tests include cache tests.

11. The apparatus of claim 10 wherein said pre-recorded test sequences include sequential write, read and compare tests, random write, read and compare tests, user specified pattern tests, cache tests, butterfly seek tests, command saturation tests, RAID specific cache tests, data corruption tests, parity corruption tests and phantom drive tests.

12. The apparatus of claim 9 wherein said RAID specific tests include data corruption tests.

13. The apparatus of claim 9 wherein said RAID specific tests include parity corruption tests.

14. The apparatus of claim 9 wherein said RAID specific tests include phantom drive tests.

15. The apparatus of claim 1, wherein said pre-recorded test sequences include sequential write, read and compare tests.

16. The apparatus of claim 1, wherein said pre-recorded test sequences include writes, reads and compares of user-specified patterns.

17. The apparatus of claim 1, wherein said tests for random access devices include command saturation tests.

18. An apparatus for performing self-testing in a storage system, comprising:
- a controller for activating physical devices of said storage system, said controller having a microprocessor, a memory, a host interface and at least one input/output processor;
- a user interface device connected to said controller, said user interface device further comprising a display monitor, control logic and a transmitting/receiving capability;
- a designated location within said storage system for holding pre-recorded test sequences;
- user interface logic within said controller for acting upon signals from said user interface device to cause said controller to transfer said pre-recorded test sequences into said memory of said controller for execution, so that said pre-recorded test sequences can be executed in said storage system, thereby performing self-testing.

19. A method for performing self-testing in a storage system, comprising the steps of:
- activating physical devices of said storage system, by a controller having a microprocessor, a memory, a host interface and at least one input/output processor;
- transmitting a signal from a user interface device connected to said controller, said user interface device having a signal transmitting/receiving capability;
- specifying a designated location within said storage system for holding pre-recorded test sequences;
- operating user interface logic within said controller for acting upon signals from said user interface device to cause said controller to transfer said pre-recorded test sequences into said memory of said controller for execution, so that said pre-recorded test sequences can be executed in said storage system, thereby performing self-testing.

20. The method of claim 19, wherein said step of operating said user interface logic includes a step of analyzing the information conveyed by signals transmitted from said user interface device, to determine which of said pre-recorded test sequences to run.

21. The method of claim 20, wherein said step of operating user interface logic further comprises the step of uploading firmware into said memory of said controller from a physical device of said storage subsystem.

22. The method of claim 20, wherein said step of operating user interface logic comprises the step of downloading software from said user interface device into said memory of said controller.

23. The method of claim 19, wherein said step of running pre-recorded test sequences includes the step of running tests for random access storage devices.

24. The apparatus of claim 23, wherein said step of running tests for random access storage devices includes the step of running random write, read and compare tests.

25. The method of claim 23, wherein said step of running tests for random access devices includes the step of running command saturation tests.

26. The method of claim 23, wherein said step of running tests for random access devices includes the step of running butterfly seek tests.

27. The method of claim 23, wherein said step of running tests for random access devices includes the step of running cache tests.

28. The method of claim 19, wherein said step of running pre-recorded test sequences includes the step of running RAID specific tests for random access storage devices having RAID features.

29. The method of claim 28 wherein said step of running RAID specific tests includes the step of running cache tests.

30. The method of claim 28 wherein said step of running RAID specific tests includes the step of running data corruption tests.

31. The method of claim 28 wherein said step of running RAID specific tests includes the step of running parity corruption tests.

32. The method of claim 28 wherein said step of running RAID specific tests includes the step of running phantom drive tests.

33. The method of claim 19, wherein the step of running said pre-recorded test sequences includes the step of running sequential write, read and compare tests.

34. The method of claim 19, wherein said step of running pre-recorded test sequences includes the step of running writes, reads and compares of user-specified patterns.

35. A method of verifying the design and operation of a storage system having a controller, memory and at least one input/output processor, comprising the steps of:
- pre-recording test sequences in a designated location in said storage system;
- signalling a request to run said test sequences by transmitting a signal from a user interface device connected to said controller;
- operating user interface logic to cause said test sequences to be executed in said controller, thereby verifying the design and operation of said storage system.

* * * * *